United States Patent
Huang

(10) Patent No.: US 12,424,261 B2
(45) Date of Patent: *Sep. 23, 2025

(54) SIGNAL SAMPLING CIRCUIT WITH COMMANDS/ADDRESS SIGNAL DIVIDED INTO ODD AND EVEN SIGNALS AND SEMICONDUCTOR MEMORY

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 177 days.

This patent is subject to a terminal disclaimer.

(21) Appl. No.: 18/449,060

(22) Filed: Aug. 14, 2023

(65) Prior Publication Data

US 2023/0386553 A1    Nov. 30, 2023

Related U.S. Application Data

(63) Continuation of application No. PCT/CN2022/099265, filed on Jun. 16, 2022.

(30) Foreign Application Priority Data

Mar. 23, 2022    (CN) .......................... 202210291688.8

(51) Int. Cl.
  *G11C 11/4072*    (2006.01)
  *G11C 7/10*    (2006.01)
  *G11C 11/4076*    (2006.01)

(52) U.S. Cl.
  CPC ........ *G11C 11/4072* (2013.01); *G11C 7/1063* (2013.01); *G11C 11/4076* (2013.01)

(58) Field of Classification Search
  CPC ............ G11C 11/4072; G11C 11/4076; G11C 11/413; G11C 11/415; G11C 7/1063; G11C 7/222; G11C 8/18
  See application file for complete search history.

(56) References Cited

U.S. PATENT DOCUMENTS 9,088,287 B2    7/2015    Choi
10,063,234 B1    8/2018    Mazumder
(Continued)

FOREIGN PATENT DOCUMENTS

CN    109903793 A    6/2019
CN    110574111 A    12/2019
(Continued)

OTHER PUBLICATIONS

International Search Report in the international application No. PCT/CN2022/099265, mailed on Dec. 7, 2022. 3 pages.

*Primary Examiner* — Sultana Begum
(74) *Attorney, Agent, or Firm* — SYNCODA LLC; Feng Ma

(57) ABSTRACT

A signal sampling circuit and a semiconductor memory are provided. The signal sampling circuit includes: an input sampling circuit, configured to sample a first CS signal and a first CA signal according to a first clock signal to obtain a second CS signal and a second CA signal; a logical operation circuit, configured to perform a logical operation on the first clock signal and the second CS signal; a command decoding circuit, configured to decode and sample an initial command signal according to the second CS signal and the CS clock signal; and an output combined circuit, configured to: sample the second odd CA signal and the second even CA signal according to the even CS clock signal and the odd CS clock signal; and sample the second odd CA signal and the (Continued)

second even CA signal according to the odd CS clock signal and the even CS clock signal.

17 Claims, 14 Drawing Sheets

(56) References Cited

U.S. PATENT DOCUMENTS

| | | |
|---|---|---|
| 10,254,782 B2 | 4/2019 | He |
| 10,354,704 B2 * | 7/2019 | Jung .................... G11C 7/1084 |
| 10,679,683 B1 | 6/2020 | Chen |
| 2014/0253188 A1 | 9/2014 | Choi |
| 2018/0059764 A1 | 3/2018 | He |
| 2019/0180803 A1 | 6/2019 | Jung |
| 2023/0081627 A1 | 3/2023 | Li |
| 2023/0307023 A1 * | 9/2023 | Huang ................ G11C 11/4076 |

FOREIGN PATENT DOCUMENTS

| | | |
|---|---|---|
| CN | 115798539 A | 3/2023 |
| WO | 2023035411 A1 | 3/2023 |

* cited by examiner

US 12,424,261 B2

SIGNAL SAMPLING CIRCUIT WITH COMMANDS/ADDRESS SIGNAL DIVIDED INTO ODD AND EVEN SIGNALS AND SEMICONDUCTOR MEMORY

CROSS-REFERENCE TO RELATED APPLICATION

This application is a continuation of International Application No. PCT/CN2022/099265, filed on Jun. 16, 2022, which claims priority to Chinese patent application No. 202210291688.8, filed on Mar. 23, 2022 in China Patent Office and entitled "SIGNAL SAMPLING CIRCUIT AND SEMICONDUCTOR MEMORY". The disclosures of International Application No. PCT/CN2022/099265 and Chinese patent application No. 202210291688.8 are hereby incorporated by reference in their entireties.

BACKGROUND

With the developing of semiconductor technologies, an increasingly high data transmission speed is required when the devices such as computers are manufactured and used. To implement a higher data transmission speed, a series of devices such as a memory that can transmit data at a double data rate (DDR) have emerged.

In a dynamic random access memory (DRAM), a command/address (CA) signal needs to be sampled as an address signal and sampled and decoded as a command signal. In particular, in a case that the CA signal is designed to be a signal of two clock cycles, a timing sequence skew is likely to occur between the address signal and the command signal. In addition, a large number of address buses are involved, resulting in a large circuit area.

SUMMARY

According to a first aspect, the embodiments of the present disclosure provide a signal sampling circuit. The signal sampling circuit includes an input sampling circuit, a logical operation circuit, a command decoding circuit, and an output combined circuit. The input sampling circuit is configured to sample a first chip select (CS) signal and a first CA signal, respectively, according to a first clock signal to obtain a second CS signal and a second CA signal. The second CA signal includes an initial command signal. The second CA signal includes a second odd CA signal and a second even CA signal. The logical operation circuit is configured to perform a logical operation on the first clock signal and the second CS signal to obtain a CS clock signal. The CS clock signal includes an odd CS clock signal and an even CS clock signal. The command decoding circuit is configured to decode and sample the initial command signal according to the second CS signal and the CS clock signal to obtain a target command signal. The output combined circuit is configured to sample the second odd CA signal and the second even CA signal according to the even CS clock signal and the odd CS clock signal, respectively, to obtain a first target address signal; and sample the second odd CA signal and the second even CA signal according to the odd CS clock signal and the even CS clock signal, respectively, to obtain a second target address signal.

According to a second aspect, the embodiments of the present disclosure provide a semiconductor memory, including the signal sampling circuit according to any one of the first aspect.

DETAILED DESCRIPTION

The following clearly and completely describes the technical solutions in the embodiments of the present disclosure with reference to the accompanying drawings in the embodiments of the present disclosure. It is to be understood that the specific embodiments described herein are merely intended to explain the present disclosure, rather than to limit the present disclosure. It is also to be noted that, for convenience of description, only the parts related to the present disclosure are shown in the accompanying drawings.

Unless otherwise defined, all technical and scientific terms used herein have the same meaning as commonly understood by those skilled in the technical field of the present disclosure. The terms used herein are merely intended to describe the embodiments of the present disclosure, rather than to limit the present disclosure.

In the following description, "some embodiments" involved indicates a subset of all possible embodiments. However, it is to be understood that "some embodiments" may be a same subset or different subsets of all possible embodiments and may be combined with each other provided that no conflict exists.

It is to be noted that the terms "first", "second", and "third" in the embodiments of the present disclosure are merely intended to distinguish similar objects but do not indicate a specific order of the objects. It is to be understood that if allowed, "first", "second", and "third" may be interchanged in a specific order or sequence to enable the described embodiments of the present disclosure to be implemented in the sequence other than that illustrated or described herein.

The following explains technical terms involved in the embodiments of the present disclosure and a correspondence of some terms.

DRAM refers to dynamic random access memory.
SDRAM refers to synchronous DRAM.
DDR refers to double data rate.
DDR4 refers to the $4^{th}$ generation of DDR ($4^{th}$ DDR).
DDR5 refers to the $5^{th}$ generation of DDR ($5^{th}$ DDR).
CMD/ADD or CA refers to Command/Address.
CLK refers to Clock input.
CS refers to Chip Select input.
RPT refers to buffer/repeater.
CMD DEC refers to command decoder.
DFF refers to data flip-flop or delay flip-flop.
PVT refers to process, voltage, and temperature.

It is to be understood that, taking the design of a DDR5 DRAM as an example, the CA input may be used as an address to be sampled and as a command to be sampled and decoded. CA herein is a collective term for various CA signals of the DRAM, may include command signals, and includes command signals such as row address strobe (RAS), column address strobe (CAS), write (WE), and active (ACT), and may further include address signals of A13~A0. In addition, in practical application, the CA signal includes several-bits of address signal. This may be determined based on specifications of the DRAM and is not limited in the embodiments of the present disclosure.

Figure 1:
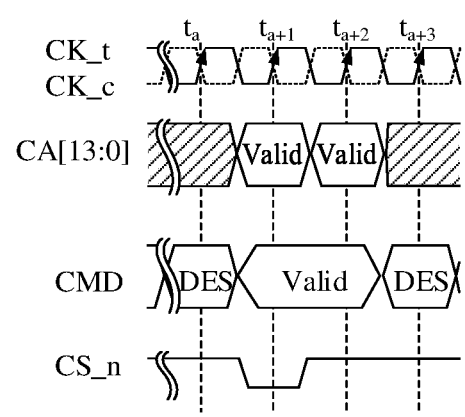
FIG. 1 is a schematic diagram of a signal timing sequence of command of two clock cycles.

For 2 T CMD of a DDR5 DRAM, FIG. 1 illustrates a schematic diagram of a signal timing sequence of a command of two clock cycles. In FIG. 1, CK_t and CK_c are a pair of input complementary clock signals. CA[13:0] is the CA input. CMD is a command signal obtained after CA decoding. CS_n is a CS signal indicating that CA is valid. As shown in FIG. 1, CA[13:0] is a signal that lasts for two clock cycles. CA in the first clock cycle and CA in the second clock cycle need to be used as address signals for performing sampling. CA in the first clock cycle also needs to be used as a command signal for performing sampling and decoding. Specifically, in DDR5, CA[4:0] in the first clock cycle needs to be used as a command signal for performing decoding and sampling. In addition, the clock cycle is a clock cycle of CK_t/CK_c.

Figure 2:
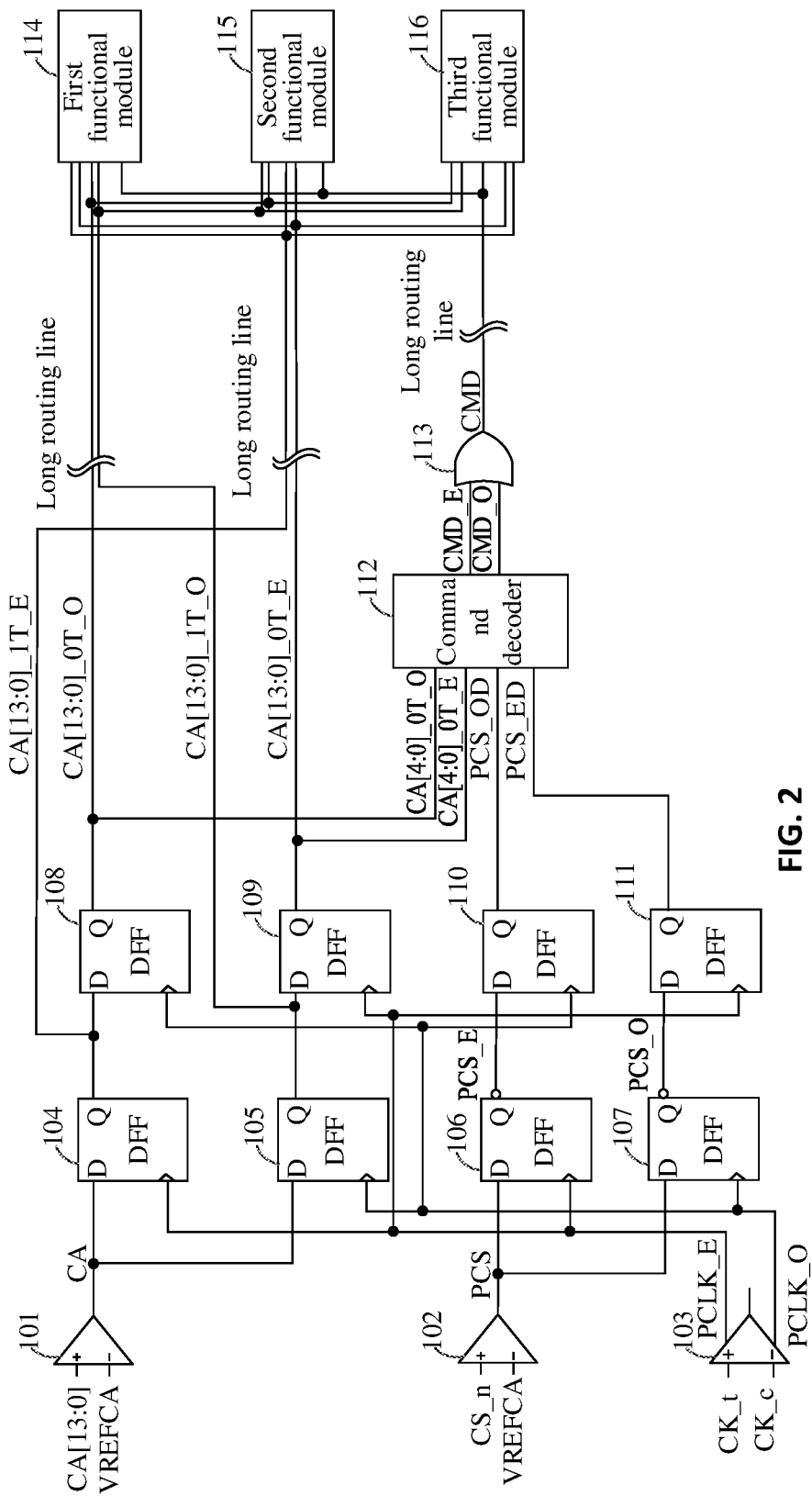
FIG. 2 is a schematic diagram of a composition structure of a signal sampling circuit.
Figure 3:
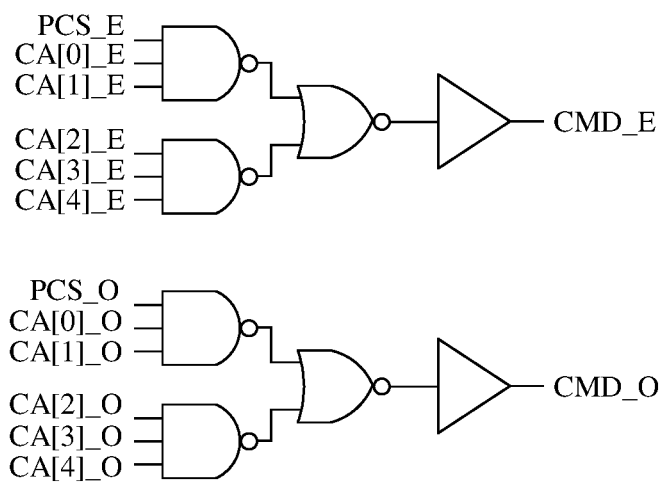
FIG. 3 is a schematic diagram of a composition structure of a command decoder.

For example, FIG. 2 illustrates a schematic diagram of a composition structure of a signal sampling circuit. As shown in FIG. 2, the signal sampling circuit includes a first receiver 101, a second receiver 102, a third receiver 103, a first sampling circuit 104, a second sampling circuit 105, a third sampling circuit 106, a fourth sampling circuit 107, a fifth sampling circuit 108, a sixth sampling circuit 109, a seventh sampling circuit 110, an eighth sampling circuit 111, a command decoder 112, an OR gate 113, a first functional module 114, a second functional module 115, and a third functional module 116. The first sampling circuit 104, the second sampling circuit 105, the fifth sampling circuit 108, the sixth sampling circuit 109, the seventh sampling circuit 110, and the eighth sampling circuit 111 each may include a DFF. The third sampling circuit 106 and the fourth sampling circuit 107 each may include a DFF and an inverter. In addition, the command decoder 112 may include logic components such as a three-input NAND gate, a two-input NOR gate, and a buffer, as shown in FIG. 3.

In FIG. 1, input signals of the first receiver 101 are an initial CA signal (denoted by CA[13:0]) and a reference signal (denoted by VREFCA), and an output signal of the first receiver 101 is a first CA signal (denoted by CA). Input signals of the second receiver 102 are an initial CS signal (denoted by CS_n) and the reference signal (denoted by VREFCA), and an output signal of the second receiver 102 is a first CS signal (denoted by PCS). An input signal of the third receiver 103 is an initial clock signal (denoted by CK_t/CK_c). A even clock signal (denoted by PCLK_E) and an odd clock signal (denoted by PCLK_O) are obtained by performing frequency division on the initial clock signal. A clock cycle of PCLK_E/PCLK_O is twice a clock cycle of CK_t/CK_c. A frequency of PCLK_E/PCLK_O is half a frequency of CK_t/CK_c. It is to be noted that CA[13:0] herein represents a group of signals: CA[0], CA[1], . . . , and CA[13]. Correspondingly, the first receiver 101 actually includes 14 receiving circuits and output lines, and even includes the following sampling circuits. There are also 14 long routing lines, which correspond to CA[0], CA[1], . . . , and CA[13] one by one.

Then, the first sampling circuit 104 performs first-stage sampling on the first CA signal CA by using the even clock signal PCLK_E to obtain a second address even signal (denoted by CA[13:0]_1 T_E), and the fifth sampling circuit 108 performs second-stage sampling on the second address even signal CA[13:0]_1 T_E by using the odd clock signal PCLK_O to obtain a third address odd signal (denoted by CA[13:0]_0 T_O). The second sampling circuit 105 samples the first CA signal CA by using the odd clock signal PCLK_O to obtain a second address odd signal (denoted by CA[13:0]_1 T_O), and the sixth sampling circuit 109 performs second-stage sampling on the second address odd signal CA[13:0]_1 T_O by using the even clock signal PCLK_E to obtain a third address even signal (denoted by CA[13:0]_0 T_E). The third address even signal CA[13:0]_0 T_E includes an initial command even signal (denoted by CA[4:0]_0 T_E), and the third address odd signal CA[13:0]_0 T_O includes an initial command odd signal (denoted by CA[4:0]_0 T_O). It is to be noted that CA[4:0]_0 T_E and CA[4:0]_0 T_O are used for decoding to form the command signal, and are collective terms of CA[0]_0 T_E-CA[4]_0 T_E and CA[0]_0 T_O-CA[4]_0 T_O, respectively.

Simultaneously, the third sampling circuit 106 performs first-stage sampling and inversion on the first CS signal PCS by using the even clock signal PCLK_E to obtain an intermediate sampling even signal (denoted by PCS_E), and the seventh sampling circuit 110 performs second-stage sampling on the intermediate sampling even signal PCS_E by using the odd clock signal PCLK_O to obtain a second CS odd signal (denoted by PCS_OD). The fourth sampling circuit 107 performs first-stage sampling and inversion on the first CS signal PCS by using the odd clock signal PCLK_O to obtain an intermediate sampling odd signal (denoted by PCS_O), and the eighth sampling circuit 111 performs second-stage sampling on the intermediate sampling odd signal PCS_O to obtain a second CS even signal (denoted by PCS_ED).

Next, the command decoder 112 decodes the initial command even signal CA[4:0]_0 T_E, the initial command odd signal [4:0]_0 T_O, the second CS even signal PCS_ED, and the second CS odd signal PCS_OD to obtain a command even signal (denoted by CMD_E) and a command odd signal (denoted by CMD_O). Finally, the OR gate 113 performs an OR operation on the command even signal CMD_E and the command odd signal CMD_O to obtain a target command signal (denoted by CMD). In addition, a long routing line is provided between each of the target command signal CMD, the second address odd signal CA[13:0]_1 T_O, the second address even signal CA[13:0]_1 T_E, the third address odd signal CA[13:0]_0 T_O, and the third address even signal CA[13:0]_0 T_E and each of the first functional module 114, the second functional module 115, and the third functional module 116. Therefore, the target command signal CMD, the second address odd signal CA[13:0]_1 T_O, the second address even signal CA[13:0]_1 T_E, the third address odd signal CA[13:0]_0 T_O, and the third address even signal CA[13:0]_0 T_E will simultaneously reach different functional modules through different layout routing lines to implement a next-stage function.

Figure 4:
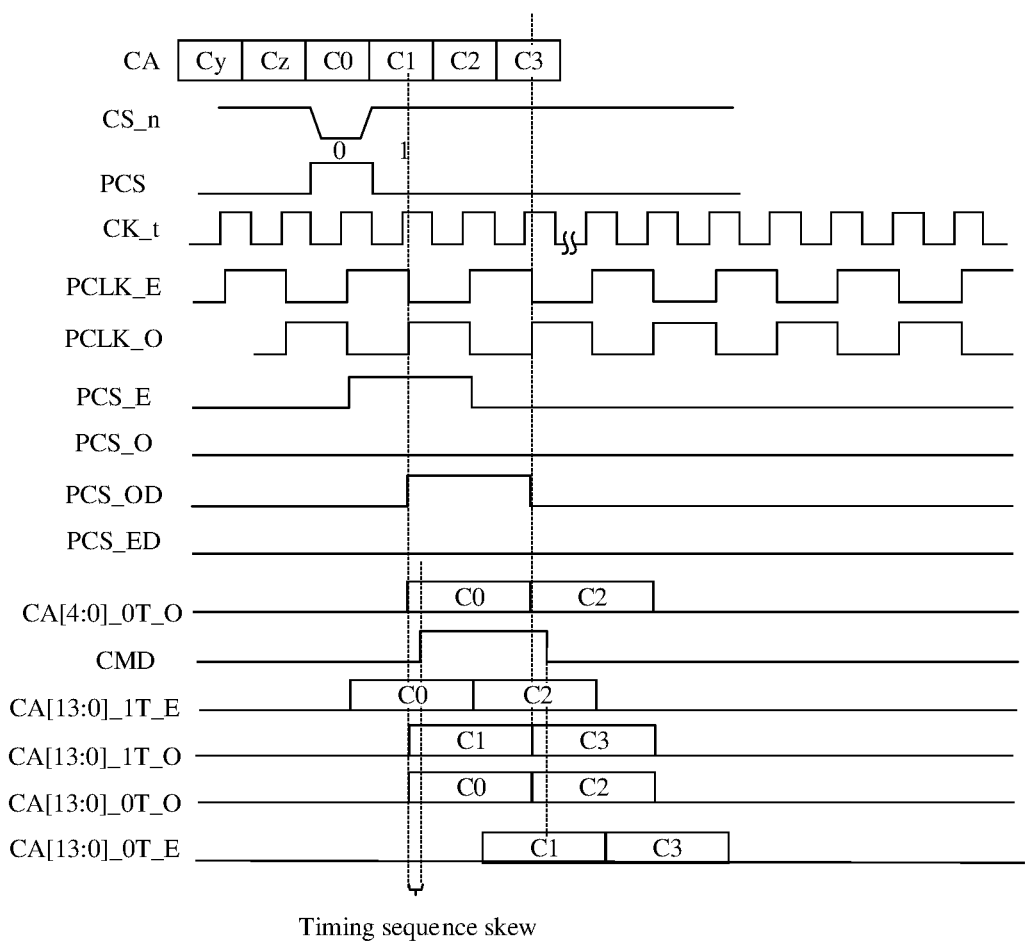
FIG. 4 is a schematic signal timing sequence diagram of a signal sampling circuit.

The single timing sequence diagram corresponding to the signal sampling circuit shown in FIG. 2 and FIG. 3 is illustrated in FIG. 4. In FIG. 4, the initial clock signal is denoted by CK_t/CK_c. The even clock signal is denoted by PCLK_E. The odd clock signal is denoted by PCLK_O. The clock cycle of CK_t/CK_c is a preset clock cycle. The clock cycle of PCLK_E/PCLK_O is twice the preset clock cycle. The first CA signal is denoted by CA. CA may include Cy, Cz, C0, C1, C2, and C3. The initial CS signal is denoted by CS_n. The first CS signal is denoted by PCS. PCS is an active low pulse signal with a pulse width of the preset clock cycle. PCS is a signal indicating that a target chip is selected. In other words, first-stage sampling is performed on the first CA signal CA with content of C0 (CA information in the first clock cycle) and the first CS signal PCS at a low level by the even clock signal PCLK_E to generate the intermediate sampling even signal PCS_E and the second address odd signal CA[13:0]_1 T_E. Then second-stage sampling is performed on these outputs by the odd clock signal PCLK_O to generate the second CS odd signal PCS_OD and the third address odd signal CA[13:0]_0 T_O. Simultaneously, first-stage sampling is performed on CA with content of C1 (CA information in the second clock cycle) by the odd clock signal PCLK_O to generate the second odd clock signal CA[13:0]_1 T_O. In this case, the second CS odd signal PCS_OD, the second address odd signal CA[13:0]_1 T_O, and the third address odd signal CA[13:0]_0 T_O are all sampled and output by the odd clock signal PCLK_O. The three groups of signals are aligned. In addition, the second CS odd signal PCS_OD and the initial command odd signal CA[4:0]_0 T_O also need to enter the command decoder 112 and the OR gate 113 for logic decoding to obtain the target command signal CMD. Therefore, there is a certain timing sequence skew among the target command signal CMD, the second address odd signal CA[13:0]_1 T_O, and the third address odd signal CA[13:0]_0 T_O, resulting in an error in a subsequent circuit.

To put it simply, after the receiver, the initial clock signal CK_t/CK_c is divided in frequency into an even clock PCLK_E and an odd clock PCLK_O to sample the first CA signal CA. For 2 T CMD of DDR5, it is necessary to use the first CA signal CA of the first clock cycle as a command and an address, and then use the first CA signal CA of the second clock cycle as a remaining address. Therefore, DDR5 design requires two stages of sampling, which are used as address signals of two clock cycles, respectively. However, meanwhile, the first CA signal CA after the second-stage sampling also needs to be used as a command signal for performing the decoding process, such that a command path has an extra logic circuit of a decoding part compared with the address path. Subsequently, the address signal and command signal simultaneously reach different modules through different layout routing lines to implement a next-stage function. In other words, the address signal may be obtained after the first CA signal CA is sampled, but it is further needed to be decoded after the first command address signal CA signal is sampled to obtain the command signal, resulting in a large timing sequence skew between the command signal and the address signal when they arrive at the next stage. The timing sequence skew may be different under different PVT conditions, resulting that an error in the next-stage function is caused due to the timing sequence skew. In addition, as shown in FIG. 2, regarding 2 T CMD, for a one-bit signal in the first CA signal CA, four different address buses need to be disposed for backward transmission, which occupies a large layout area and reduces electrical performance of a memory.

In view of this, the embodiments of the present disclosure provide a signal sampling circuit. The signal sampling circuit includes an input sampling circuit, a logical operation circuit, a command decoding circuit, and an output combined circuit. The input sampling circuit is configured to sample a first CS signal and a first CA signal according to a first clock signal, respectively, to obtain a second CS signal and a second CA signal. The second CA signal includes an initial command signal. The second CA signal includes a second odd CA signal and a second even CA signal. The logical operation circuit is configured to perform a logical operation on the first clock signal and the second CS signal to obtain a CS clock signal. The CS clock signal includes an odd CS clock signal and an even CS clock signal. The command decoding circuit is configured to decode and sample the initial command signal according to the second CS signal and the CS clock signal to obtain a target command signal. The output combined circuit is configured to sample the second odd CA signal and the second even CA signal according to the even CS clock signal and the odd CS clock signal, respectively, to obtain a first target address signal; and sample the second odd CA signal and the second even CA signal according to the odd CS clock signal and the even CS clock signal, respectively, to obtain a second target address signal. Timing sequences of the target command signal, the first target address signal, and the second target address signal are aligned. In this way, based on the signal sampling circuit, the timing sequences of the target command signal, the first target address signal, and the second target address signal can be aligned under sampling at a same clock cycle, such that there is no timing sequence skew between the command signal and the address signal after performing decoding with the change of PVT. This can avoid a problem of a next-stage functional module caused due to the timing sequence skew. In addition, odd and even address buses can also be combined through the output combined process, to halve the number of address buses.

The embodiments of the present disclosure are described in detail below with reference to the accompanying drawings.

Figure 5:
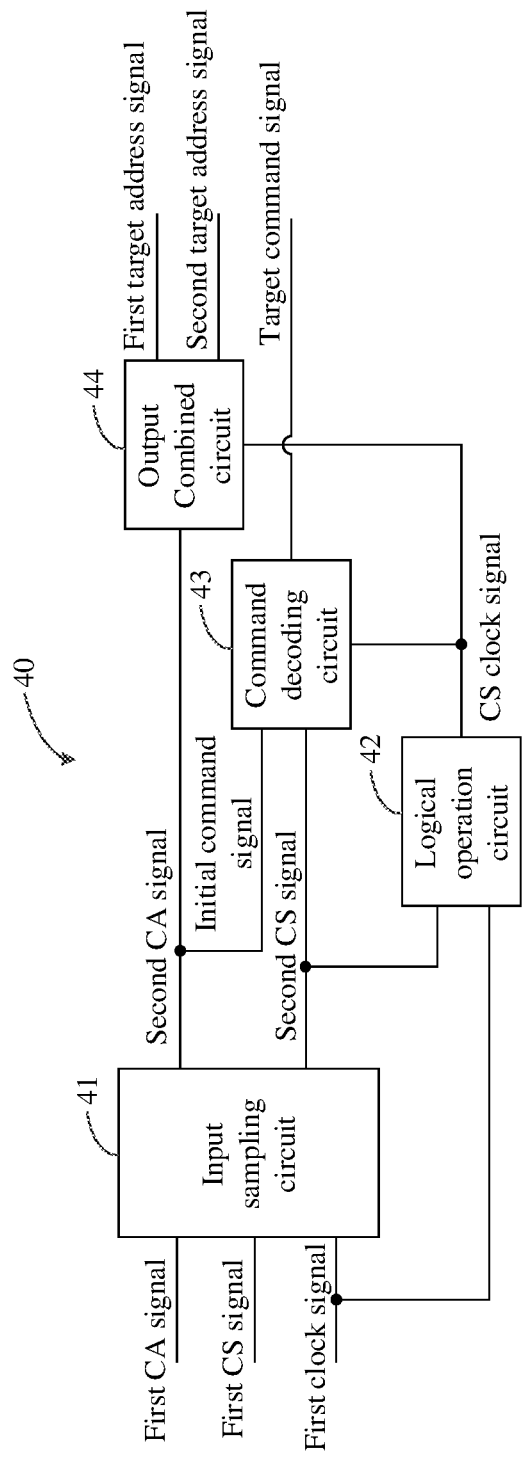
FIG. 5 is a schematic diagram of a composition structure of a signal sampling circuit according to an embodiment of the present disclosure.

In an embodiment of the present disclosure, FIG. 5 illustrates a schematic diagram of a composition structure of a signal sampling circuit 40 according to an embodiment of the present disclosure. As shown in FIG. 5, the signal sampling circuit 40 may include an input sampling circuit 41, a logical operation circuit 42, a command decoding circuit 43, and an output combined circuit 44.

The input sampling circuit 41 is configured to sample a first CS signal and a first CA signal according to a first clock signal, respectively, to obtain a second CS signal and a second CA signal. The second CA signal includes an initial command signal. The second CA signal includes a second odd CA signal and a second even CA signal.

The logical operation circuit 42 is configured to perform a logical operation on the first clock signal and the second CS signal to obtain a CS clock signal. The CS clock signal includes an odd CS clock signal and an even CS clock signal.

The command decoding circuit 43 is configured to decode and sample the initial command signal according to the second CS signal and the CS clock signal to obtain a target command signal.

The output combined circuit 44 is configured to sample the second odd CA signal and the second even CA signal according to the even CS clock signal and the odd CS clock signal, respectively, to obtain a first target address signal; and sample the second odd CA signal and the second even CA signal according to the odd CS clock signal and the even CS clock signal, respectively, to obtain a second target address signal.

It is to be noted that the signal sampling circuit 40 in this embodiment of the present disclosure is applied to a sampling and decoding process of an address signal and a command signal, and may specifically be applied to various circuit scenarios. This embodiment of the present disclosure is explained and illustrated in terms of decoding of CA in a DRAM, but this does not constitute a relevant limitation.

The signal sampling circuit 40 in the embodiment of the present disclosure is applied to a command signal of two clock cycles (namely, 2 T CMD). In other words, the first CA signal herein includes a valid signal of two clock cycles. Correspondingly, the target command signal includes a valid command of two clock cycles, as specifically shown in FIG. 1. In FIG. 1, CS_n is an active low pulse signal with a pulse width of one clock cycle. A CA[13:0] signal corresponding to this clock cycle and a next clock cycle of this clock cycle is valid. For 2 T CMD, CA of the first and second clock cycles needs to be sampled as an address signal, and CA of the first clock cycle also needs to be sampled and decoded as a command signal.

Correspondingly, in this embodiment of the present disclosure, the command decoding circuit 43 is configured to output the target command signal. The output combined circuit 44 is configured to output the first target address signal and the second target address signal. The first target address signal indicates CA information in the first clock cycle. The second target address signal indicates CA information in the second clock cycle.

It is to be noted that the second CA signal includes the second even CA signal and the second odd CA signal. The CS clock signal includes the odd CS clock signal and the even CS clock signal. The output combined circuit 44 performs cross-sampling on the second CA signal by using the CS clock signal to obtain the first target address signal; and perform corresponding sampling on the second CA signal by using the CS clock signal to obtain the second target address signal.

The cross-sampling indicates that: the sampling is performed on the second odd CA signal by using the even CS clock signal and the sampling is performed on the second even CA signal by using the odd CS clock signal. The corresponding sampling indicates that: the sampling is performed on the second even CA signal by using the even CS clock signal and the sampling is performed on the second odd CA signal by using the odd CS clock signal.

It is to be noted that after passing through the logical operation circuit 42, only one of the odd CS clock signal and the even CS clock signal is valid. In this way, in a case that the odd CS clock signal is valid, the target command signal is output by performing sampling by the command decoding circuit 43 according to the odd CS clock signal. The first target address signal is output by sampling the second even CA signal by the output combined circuit 44 according to the odd CS clock signal. The second target address signal is output by sampling the second odd CA signal by the output combined circuit 44 according to the odd CS clock signal. In a case that the even CS clock signal is valid, the target command signal is output by performing sampling by the command decoding circuit 43 according to the even CS clock signal. The first target address signal is output by sampling the second odd CA signal by the output combined circuit 44 according to the even CS clock signal to output. The second target address signal is output by sampling the second even CA signal by the output combined circuit 44 according to the even CS clock signal.

In other words, the target command signal, the first target address signal, and the second target address signal are output by performing sampling through a same signal (the even CS clock signal or the even CS clock signal). Therefore, the timing sequences of the target command signal, the first target address signal, and the second target address signal are aligned, such that the timing sequence skew between the command signal and the address signal can be avoided, and the timing sequence skew between the command signal and the address signal does not change with the PVT. This can avoid a problem of the next-stage functional module occurred due to the timing sequence skew. The timing sequence alignment herein indicates that the target command signal, the first target address signal, and the second target address signal simultaneously change from a low level to a high level or from a high level to a low level. In the embodiments of the present disclosure, "timing sequence alignment" and "simultaneously" indicates that a timing sequence skew falls within a preset accuracy range.

Figure 6:
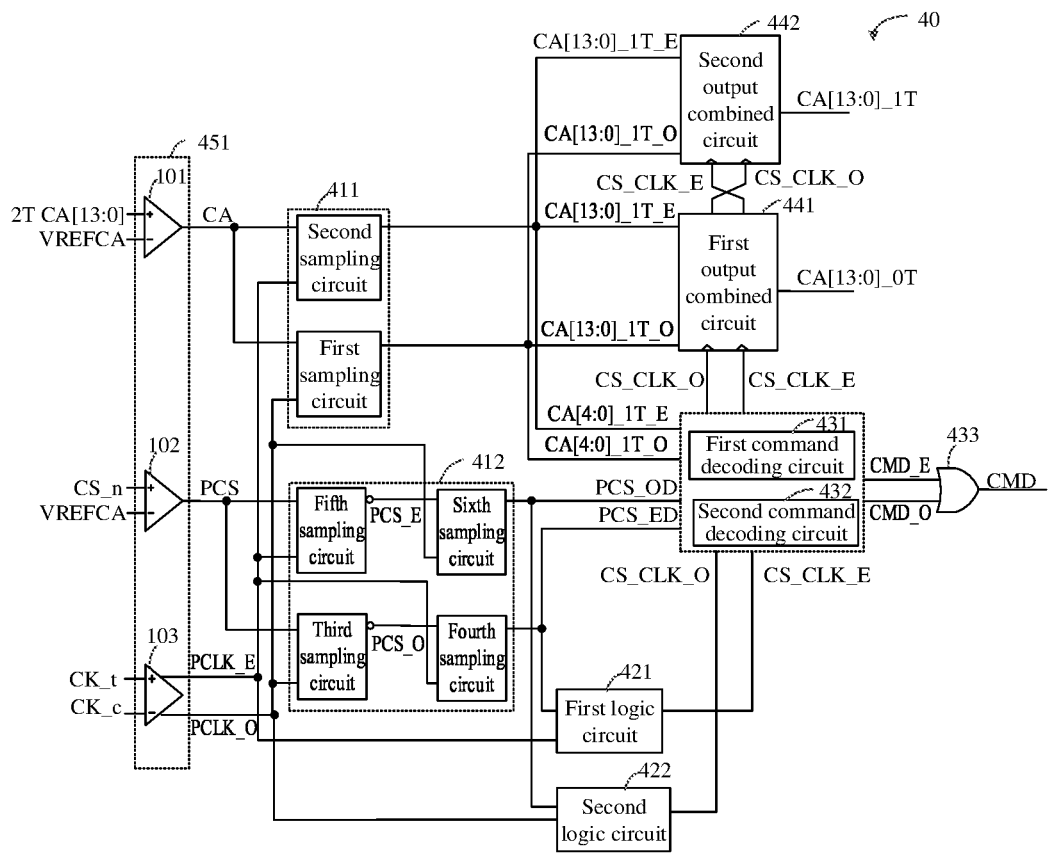
FIG. 6 is a schematic diagram of a composition structure of another signal sampling circuit according to an embodiment of the present disclosure.

In some embodiments, on the basis of the signal sampling circuit 40 shown in FIG. 5, referring to FIG. 6, the signal sampling circuit 40 may further include a receiving circuit 45. The receiving circuit 45 includes a first receiving circuit 451, a second receiving circuit 452, and a third receiving circuit 453.

The first receiving circuit 451 is configured to receive an initial CA signal and output the first CA signal.

The second receiving circuit 452 is configured to receive an initial CS signal and output the first CS signal.

The third receiving circuit 453 is configured to receive an initial clock signal and perform frequency division on the initial clock signal to obtain an odd clock signal and an even clock signal.

Herein, the odd clock signal and the even clock signal constitute the aforementioned first clock signal. In particular, the odd clock signal and the even clock signal are obtained after performing frequency division on the initial clock signal. Therefore, the clock cycles of the odd clock signal and the even clock signal are both twice a clock cycle of the initial clock signal. In addition, a phase difference between the odd clock signal and the even clock signal is 180 degrees.

It is to be noted that the first CA signal, the first CS signal, and the first clock signal may be obtained through the receiving circuit 45, and then input to the input sampling circuit 41 for sampling and the subsequent logical operation.

Herein, the first receiving circuit 451, the second receiving circuit 452, or the third receiving circuit 453 may be a receiver (denoted by Receiver) or a buffer (denoted by Buffer).

It is also to be noted that in FIG. 6, the initial CA signal may be denoted by CA[13:0], and the first CA signal is denoted by CA. The initial CS signal may be denoted by CS_n. The first CS signal may be denoted by PCS. The initial clock signal may be denoted by CK_t and CK_c. The even clock signal is denoted by PCLK_E, and the odd clock signal is denoted by PCLK_O.

In addition, it is to be noted that either the initial CA signal or the first CA signal is not one signal, but represent a group of CA signals, namely, CA[0]~CA[13]. Therefore, for the first receiving circuits 451, there may be 14 receiving circuits configured to receive 14 signals CA[0], CA[1], . . . , and CA[13]. Only one receiving circuit is shown in the figure for illustration.

In some embodiments, the input sampling circuit 41 includes a CA sampling circuit 411. The CA sampling circuit 411 includes a first sampling circuit and a second sampling circuit.

The first sampling circuit is configured to sample the first CA signal according to the odd clock signal to obtain the second odd CA signal.

The second sampling circuit is configured to sample the first CA signal according to the even clock signal to obtain the second even CA signal.

It is to be noted that the initial command signal includes an initial command even signal and an initial command odd signal, the second even CA signal includes the initial command even signal, and the second odd CA signal includes the initial command odd signal.

In FIG. 6, the second even CA signal may be denoted by CA[13:0]_1 T_E, the second odd CA signal may be denoted by CA[13:0]_1 T_O, the initial command even signal may be denoted by CA[4:0]_1 T_E, and the initial command odd signal may be denoted by CA[4:0]_1 T_O. In particular, in the foregoing symbols, "1 T" does not have a particularly limiting meaning.

It is to be noted that CA[13:0]_1 T_E is also not one signal, but represents a group of CA signals, namely, CA[0]_1_TE-CA[13]_1 T_E. CA[4:0]_1 T_E represents CA[0]_1 T_E-CA[4]_1 T_E in this group of signals. CA[13:0]_1 T_O is also not one signal, but represents a group of CA signals, namely, CA[0]_1 T_O-CA[13]_1 T_O. CA[4:0]_1 T_O represents CA[0]_1 T_O-CA[4]_1 T_O in this group of signals.

As shown in FIG. 6, the first sampling circuit and the second sampling circuit each may include a DFF. For the first sampling circuit, a clock port of the DFF is connected with the odd clock signal PCLK_O, an input port of the DFF is connected with the first CA signal CA, and an output port of the DFF is configured to output the second odd CA signal CA[13:0]_1 T_O. The second odd CA signal CA[13:0]_1 T_O includes the initial command odd signal CA[4:0]_1 T_O. For the second sampling circuit, a clock port of the DFF is connected with the even clock signal PCLK_E, an input port of the DFF is connected with the first CA signal CA, and an output port of the DFF is configured to output the second even CA signal CA[13:0]_1 T_E. The second even CA signal CA[13:0]_1 T_E includes the initial command even signal CA[4:0]_1 T_E.

In some embodiments, the input sampling circuit 41 further includes a CS sampling circuit 412. The CS sampling circuit 412 includes a third sampling circuit, a fourth sampling circuit, a fifth sampling circuit, and a sixth sampling circuit.

The third sampling circuit is configured to sample the first CS signal according to the odd clock signal to obtain an intermediate sampling odd signal.

The fourth sampling circuit is configured to sample the intermediate sampling odd signal according to the even clock signal to obtain a second CS even signal.

The fifth sampling circuit is configured to sample the first CS signal according to the even clock signal to obtain an intermediate sampling even signal.

The sixth sampling circuit is configured to sample the intermediate sampling even signal according to the odd clock signal to obtain a second CS odd signal.

It is further to be noted that in FIG. 6, the intermediate sampling odd signal may be denoted by PCS_O, and the second CS even signal may be denoted by PCS_ED. The intermediate sampling even signal may be denoted by PCS_E, and the second CS odd signal may be denoted by PCS_OD.

Specifically, as shown in FIG. 6, the third sampling circuit may include a DFF and an inverter. The fourth sampling circuit may include a DFF. For the third sampling circuit, a clock port of the DFF is connected with the odd clock signal PCLK_O, an input port of the DFF is connected with the first CS signal PCS, an output port of the DFF is connected to an input port of the inverter, and an output port of the inverter is configured to output the intermediate sampling odd signal PCS_O. For the fourth sampling circuit, a clock port of the DFF is connected with PCLK_E, an input port of the DFF is connected with the intermediate sampling odd signal PCS_O, and an output port of the D-type flip-flop is configured to output the second CS even signal PCS_ED.

The fifth sampling circuit may include a DFF and an inverter. The sixth sampling circuit may include a DFF. For the fifth sampling circuit, a clock port of the DFF is connected with the even clock signal PCLK_E, an input port of the DFF is connected with the first CS signal PCS, an output port of the DFF is connected with an input port of the inverter, and an output port of the inverter is configured to output the intermediate sampling even signal PCS_E. For the sixth sampling circuit, a clock port of the DFF is connected with the odd clock signal PCLK_O, an input port of the DFF is connected with the intermediate sampling even signal PCS_E, and an output port of the DFF is configured to output the second CS odd signal PCS_OD.

It is to be understood that because the first CS signal PCS is an active low pulse signal, the inverter needs to be disposed in the third sampling circuit or the fifth sampling circuit, such that the intermediate sampling even signal PCS_E or the intermediate sampling odd signal PCS_O becomes an active high pulse signal to facilitate a subsequent logical operation. In addition, the inverter may not need to be disposed in the third sampling circuit and the fifth sampling circuit. In this case, the subsequent logical operation needs to be adjusted to achieve the same effect.

In this way, the even clock signal, the odd clock signal, the second CS even signal, the second CS odd signal, the second even CA signal, the second odd CA signal, the initial command even signal, and the initial command odd signal may be obtained after passing the receiving circuit 45 and the input sampling circuit 41. Then, the even clock signal, the odd clock signal, the second CS even signal, and the second CS odd signal are calculated to obtain the odd CS clock signal and the even CS clock signal. Finally, the second even CA signal and the second odd CA signal are sampled through a valid CS clock signal, and the initial command even signal or the initial command odd signal is decoded and sampled, such that timing sequences of the finally output address signal and command signal can be aligned.

In this embodiment of the present disclosure, a logical operation is performed on the even clock signal, the odd clock signal, the second CS even signal, and the second CS odd signal to obtain the CS clock signal, such that the odd-even sampling may be performed on the command decoding circuit 43 and the output combined circuit 44 subsequently, to halve the quantity of address buses. Therefore, in some embodiments, as shown in FIG. 6, the logical operation circuit 42 includes a first logic circuit 421 and a second logic circuit 422.

The first logic circuit 421 is configured to receive the even clock signal and the second CS even signal, and perform a logical operation on the even clock signal and the second CS even signal to obtain the even CS clock signal.

The second logic circuit 422 is configured to receive the odd clock signal and the second CS odd signal, and perform a logical operation on the odd clock signal and the second CS odd signal to obtain the odd CS clock signal.

It is to be noted that in FIG. 6, the even CS clock signal may be denoted by CS_CLK_E, and the odd CS clock signal may be denoted by CS_CLK_O.

In a specific embodiment, for the first logic circuit 421, the first logic circuit 421 may include a first buffer and a first AND gate.

The first buffer is configured to delay the even clock signal to obtain an intermediate even clock signal.

The first AND gate is configured to perform an AND operation on the second CS even signal and the intermediate even clock signal to obtain the even CS clock signal.

In another specific embodiment, for the second logic circuit 422, the second logic circuit 422 may include a second buffer and a second AND gate.

The second buffer is configured to delay the odd clock signal to obtain an intermediate odd clock signal.

The second AND gate is configured to perform an AND operation on the second CS odd signal and the intermediate odd clock signal to obtain the odd CS clock signal.

It is to be noted that the buffers, including the first buffer and the second buffer, have a function of enhancing a signal driving capability in addition to a delay function. Specifically, for the intermediate even clock signal and the even clock signal, the intermediate even clock signal not only has a delay compared with the even clock signal, but also has a stronger driving capability. For the intermediate odd clock signal and the odd clock signal, the intermediate odd clock signal not only has a delay compared with the odd clock signal, but also has a stronger driving capability.

It is further to be noted that as shown in FIG. 6, the even CS clock signal CS_CLK_E is obtained by the first logic circuit 421, and the odd CS clock signal CS_CLK_O is obtained by the second logic circuit 422. In this embodiment of the present disclosure, related processing is performed on the command decoding circuit 43 and the output combined circuit 44 according to the even CS clock signal CS_CLK_E and the odd CS clock signal CS_CLK_O, such that the timing sequences of the finally output first target address signal, second target address signal, and target command signal are aligned.

It is also to be noted that in some embodiments, the first CS signal is a signal indicating that a target chip is selected, and the first CS signal is an active low pulse signal.

If the first CS signal is sampled as a low level at a rising edge of an even clock cycle, the intermediate sampling even signal and the second CS odd signal are active high pulse signals, and the odd CS clock signal is active high pulse signal; or if the first CS signal is sampled as a low level at a rising edge of an odd clock cycle, the intermediate sampling odd signal and the second CS even signal are active high pulse signals, and the even CS clock signal is active high pulse signal.

Herein, the even clock cycle or the odd clock cycle is the clock cycle of the initial clock signal CK_t/CK_c. Specifically, the odd clock signal PCLK_E and the even clock signal PCLK_O may be obtained through the frequency division performed by the third receiving circuit 453. Then, a clock cycle in which a rising edge of the even clock signal PCLK_E is located is used as the even clock cycle, and a clock cycle in which a rising edge of the odd clock signal PCLK_O is located is used as the odd clock cycle.

It is to be noted that because only one of the second CS odd signal PCS_OD and the second CS even signal PCS_ED is at a high level, the first logic circuit 421 and the second logic circuit 422 are used to make only one of the odd CS clock signal CS_CLK_O and the even CS clock signal CS_CLK_E to be an active signal at a high level, and the other signal is an inactive signal (a low-level signal). In this way, by shielding the first clock signal (even clock signal PCLK_E or odd clock signal PCLK_O) when the second CS signal is at a low level (i.e., no command), unnecessary clock signal oscillation can be reduced and the function of power consumption can be implemented.

In some embodiments, for the command decoding circuit 43, it is needed to sample and decode the odd and even signals in the initial command signal according to the even CS clock signal and the odd CS clock signal. Therefore, in some embodiments, as shown in FIG. 6, the command decoding circuit 43 may include a first command decoding circuit 431, a second command decoding circuit 432, and an OR gate 433.

The first command decoding circuit 431 is configured to decode and sample the initial command odd signal according to the even CS clock signal and the second CS even signal to obtain a command even signal.

The second command decoding circuit 432 is configured to decode and sample the initial command even signal according to the odd CS clock signal and the second CS odd signal to obtain a command odd signal.

The OR gate 433 is configured to perform an OR operation on the command even signal and the command odd signal to obtain the target command signal.

It is to be noted that in FIG. 6, the target command signal may be denoted by CMD, the command even signal may be denoted by CMD_E, and the command odd signal may be denoted by CMD_O.

It is to be noted that as shown in FIG. 6, the target command signal CMD is obtained by performing the OR operation on the command even signal CMD_E and the command odd signal CMD_O. The command even signal CMD_E is obtained by performing decoding and sampling by the first command decoding circuit 431, and the command odd signal CMD_O is obtained by performing decoding and sampling by the second command decoding circuit 432.

Figure 7A:
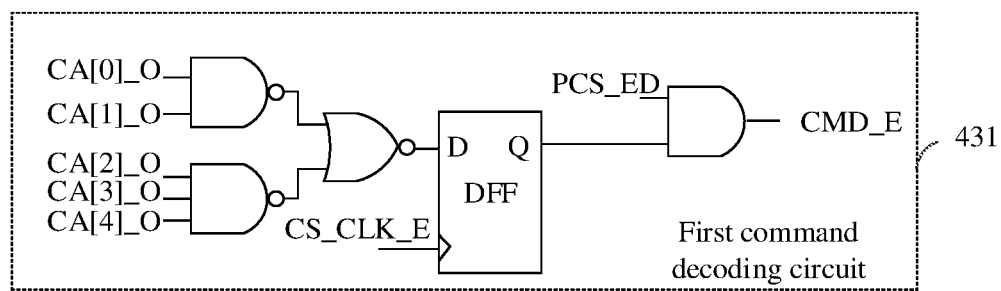
FIG. 7A is a schematic diagram of a composition structure of a first command decoding circuit according to an embodiment of the present disclosure.

In a specific embodiment, as shown in FIG. 7A, the first command decoding circuit 431 may include a first decoding circuit, a seventh sampling circuit, and a third AND gate.

The first decoding circuit is configured to decode the initial command odd signal to obtain a command decoding odd signal.

The seventh sampling circuit is configured to sample the command decoding odd signal according to the even CS clock signal to obtain a command sampling even signal.

The third AND gate is configured to perform an AND operation on the second CS even signal and the command sampling even signal to obtain the command even signal.

It is to be noted that the initial command odd signal CA[4:0]_1 T_O may include command signals CA[0]_O, CA[1]_O, CA[2]_O, CA[3]_O, and CA[4]_O, etc. The first decoding circuit includes a two-input NAND gate, a three-input NAND gate, and a two-input NOR gate. As shown in FIG. 7A, CA[0]_O and CA[1]_O are input to the two-input NAND gate, and CA[2]_O, CA[3]_O, and CA[4]_O are input to the three-input NAND gate. An output port of the two-input NAND gate and an output port of the three-input NAND gate are connected with the input ports of the two-input NOR gate. An output port of the two-input NOR gate is configured to output the command decoding odd signal. In this way, the decoding for the initial command odd signal is implemented.

It is to be noted that specific design of the first command decoding circuit 431 and the second command decoding circuit 432 is determined according to a command decoding rule. Decoding rules may be different for different products/ different application scenarios/different commands, and the logic of the command decoding circuits may also be adjusted correspondingly.

It is also to be noted that the seventh sampling circuit may also be a DFF. As shown in FIG. 7A, a clock port of the DFF is connected with the even CS clock signal CS_CLK_E, and an input port of the DFF is connected with the output port of the two-input NOR gate to receive the command decoding odd signal. An output port of the DFF is connected with one input port of the third AND gate, and the second CS even signal PCS_ED is connected with the other input port of the third AND gate, such that an output port of the third AND gate is configured to output the command even signal CMD_E. After the command decoding odd signal is sampled, it can be ensured that the command even signal CMD_E can be obtained only when the second CS even signal PCS_ED is at a high level through the third AND gate.

Figure 7B:
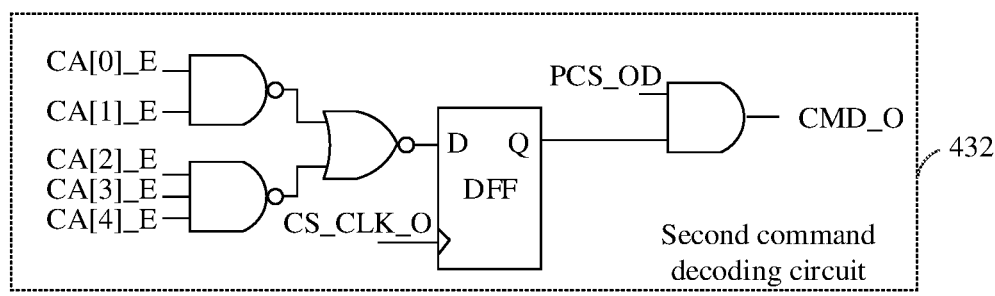
FIG. 7B is a schematic diagram of a composition structure of a first command decoding circuit according to an embodiment of the present disclosure.

In some embodiments, as shown in FIG. 7B, the second command decoding circuit 432 includes a second decoding circuit, an eighth sampling circuit, and a fourth AND gate.

The second decoding circuit is configured to decode the initial command even signal to obtain a command decoding even signal.

The eighth sampling circuit is configured to sample the command decoding even signal according to the odd CS clock signal to obtain a command sampling odd signal.

The fourth AND gate is configured to perform an AND operation on the second CS odd signal and the command sampling odd signal to obtain the command odd signal.

It is to be noted that the initial command even signal CA[4:0]_1 T_E may include command signals CA[0]_E, CA[1]_E, CA[2]_E, CA[3]_E, and CA[4]_E. The first decoding circuit may include a two-input NAND gate, a three-input NAND gate, and a two-input NOR gate. As shown in FIG. 7B, CA[0]_E and CA[1]_E are input to the two-input NAND gate, and CA[2]_E, CA[3]_E, and CA[4]_E are input to the three-input NAND gate. An output port of the two-input NAND gate and an output port of the three-input NAND gate are connected with the input ports of the two-input NOR gate, respectively, and an output port of the two-input NOR gate is configured to output the command decoding even signal. In this way, the decoding for the initial command even signal CA[4:0]_1 T_E can be implemented.

It is also to be noted that the eighth sampling circuit may also be a DFF. As shown in FIG. 7B, a clock port of the DFF is connected with the odd CS clock signal CS_CLK_O, and an input port of the DFF is connected with the output port of the two-input NOR gate to receive the command decoding even signal. An output port of the DFF is connected with one input port of the fourth AND gate, and the second CS odd signal PCS_OD is connected with the other input port of the fourth AND gate, such that an output port of the fourth AND gate is configured to output the command odd signal CMD_O. Therefore, after the command decoding even signal is sampled, it can be ensured that the command odd signal CMD_O can be obtained only when the second CS odd signal PCS_OD is at a high level through the fourth AND gate, that is, it is ensured that only one of the command even signal CMD_E and the command odd signal CMD_O is valid.

In this way, only one of the even CS clock signal CS_CLK_E and the odd CS clock signal CS_CLK_O is an active high pulse signal. If the even CS clock signal CS_CLK_E is an active high pulse signal, in this case, the sampling process of the second command decoding circuit 432 will not be performed since the odd CS clock signal CS_CLK_O is a low-level signal. That is, the command odd signal CMD_O is a low-level signal, then an OR operation is performed on the obtained command even signal CMD_E and the low-level signal by the OR gate 433, and the output signal is still the command even signal CMD_E. In other words, the command even signal CMD_E obtained at this case is the target command signal CMD. On the contrary, if the odd CS clock signal CS_CLK_O is an active high pulse signal, at this case, the sampling process of the first command decoding circuit 431 will not be performed since the even CS clock signal CS_CLK_E is a low-level signal. That is, the command even signal CMD_E is a low-level signal, then an OR operation is performed on the obtained command odd signal CMD_O and the low-level signal by the OR gate 433, and the output signal is still the command odd signal CMD_O. In other words, the command odd signal CMD_O obtained at this case is the target command signal CMD.

In some embodiments, the output combined circuit 44 includes a first output combined circuit 441 and a second output combined circuit 442.

The first output combined circuit 441 is configured to sample the second even CA signal according to the odd CS clock signal to obtain the first target address signal; or sample the second odd CA signal according to the even CS clock signal to obtain the first target address signal.

The second output combined circuit 442 is configured to sample the second odd CA signal according to the odd CS clock signal to obtain the second target address signal; or sample the second even CA signal according to the even CS clock signal to obtain the second target address signal.

It is to be noted that the first output combined circuit 441 and the second output combined circuit 442 may also be referred to as output combined flip-flops, are denoted by Output Combined DFF, and have a same internal circuit structure but different connection manners of pins and signals. The output combined flip-flop includes two data ports and two clock ports. When a signal of the first data port is sampled by using a signal of the first clock port, a signal of the second data port is also sampled by using a signal of the second clock port.

It is to be noted that in FIG. 6, the first target address signal is denoted by CA[13:0]_0 T, and the second target address signal is denoted by CA[13:0]_1 T.

As shown in FIG. 6, for the first output combined circuit 441, the first data port is connected with the second odd CA signal CA[13:0]_1 T_O, the second data port is connected with the second even CA signal CA[13:0]_1 T_E, the first clock port is connected with the even CS clock signal CS_CLK_E, and the second clock port is connected with the odd CS clock signal CS_CLK_O. In this way, the second odd CA signal CA[13:0]_1 T_O can be sampled by using the even CS clock signal CS_CLK_E, meanwhile, the second even CA signal CA[13:0]_1 T_E can be sampled by using the odd CS clock signal CS_CLK_O, to obtain the first target address signal CA[13:0]_0 T. It is to be understood that since only one of the even CS clock signal CS_CLK_E and the odd CS clock signal CS_CLK_O is valid, the first output combined circuit 441 outputs only one valid sampling result, such that odd and even address outputs originally used to respectively transmit odd and even sampling results can be combined into one sampling output, thereby halving a quantity of address buses.

As shown in FIG. 6, for the second output combined circuit 442, the first data port is connected with the second odd CA signal CA[13:0]_1 T_O, the second data port is connected with the second even CA signal CA[13:0]_1 T_E, the first clock port is connected with the odd CS clock signal CS_CLK_O, and the second clock port is connected with the even CS clock signal CS_CLK_E. In this way, the odd CS clock signal CA[13:0]_1 T_O can be sampled by using the odd CS clock signal CS_CLK_O, and the even CS clock signal CA[13:0]_1 T_E can be sampled by using the even CS clock signal CS_CLK_E, to obtain the second target address signal CA[13:0]_1 T. It is to be understood that because only one of the even CS clock signal CS_CLK_E and the odd CS clock signal CS_CLK_O is valid, the second output combined circuit 442 outputs only one valid sampling result, such that odd and even address outputs originally used to respectively transmit odd and even sampling results can be combined into one sampling output, thereby halving a quantity of address buses.

Based on the foregoing circuit structure, the first output combined circuit 441 outputs a sampling result of the first CA signal CA in the first clock cycle, and the second output combined circuit 442 outputs a sampling result of the first CA signal CA in the second clock cycle.

It is assumed that content of the first CA signal CA in 7 consecutive clock cycles is Cy, Cz, C0, C1, C2, C3, and C4, respectively.

In 2 T CMD mode, if the first CS signal PCS is in an active low state in an even clock cycle corresponding to C0, it indicates that C0 and C1 are active first CA signals CA. At this case, the second even CA signal CA[13:0]_1 T_E obtained by sampling by using the even clock signal includes C0 and C2, and the second odd CA signal CA[13:0]_1 T_O obtained by sampling by using the odd clock signal includes C1 and C3. In this case, because the odd CS clock signal CS_CLK_O is valid, C0 will be obtained after the second even CA signal CA[13:0]_1 T_E is sampled through the odd CS clock signal CS_CLK_O, and C1 will be obtained after CA[13:0]_1 T_O is sampled through the odd CS clock signal CS_CLK_O. In this way, the first output combined circuit 441 performs sampling and thus obtains the valid information C0 of CA in the first clock cycle, and the second output combined circuit 442 performs sampling and thus obtains the valid information C1 of CA in the second clock cycle.

If the first CS signal PCS is in the active low state in the odd clock cycle corresponding to C1, it indicates that C1 and C2 are active CA signals. At this case, the second even CA signal CA[13:0]_1 T_E obtained by sampling by using the even clock signal includes C2 and C4, and the second odd CA signal CA[13:0]_1 T_O obtained by sampling by using the odd clock signal includes C1 and C3. In this case, because the even CS clock signal CS_CLK_E is valid, C1 will be obtained after the second odd CA signal CA[13:0]_1 T_O is sampled through the even CS clock signal CS_CLK_E, and C2 will be obtained after the second even CA signal CA[13:0]_1 T_E is sampled through the even CS clock signal CS_CLK_E. In this way, the first output combined circuit 441 performs sampling and thus obtains the valid information C1 of the first CA signal CA in the first clock cycle, and the second output combined circuit 442 performs sampling and thus obtains the valid information C2 of the second odd CA signal CA in the second clock cycle.

Herein, the even clock cycle or the odd clock cycle is the clock cycle of the initial clock signal CK_t/CK_c. Specifically, the odd clock signal PCLK_E and the even clock signal PCLK_O may be obtained by performing the frequency division on the initial clock signal. Then, a clock cycle in which a rising edge of the even clock signal PCLK_E is located is used as the even clock cycle, and a clock cycle in which a rising edge of the odd clock signal PCLK_O is located is used as the odd clock cycle.

Therefore, the first output combined circuit 441 always outputs valid information of CA in the first clock cycle, namely, the first target address signal CA[13:0]_0 T; and the second output combined circuit 442 always outputs valid information of CA in the second clock cycle, namely, the second target address signal CA[13:0]_1 T.

Figure 8A:
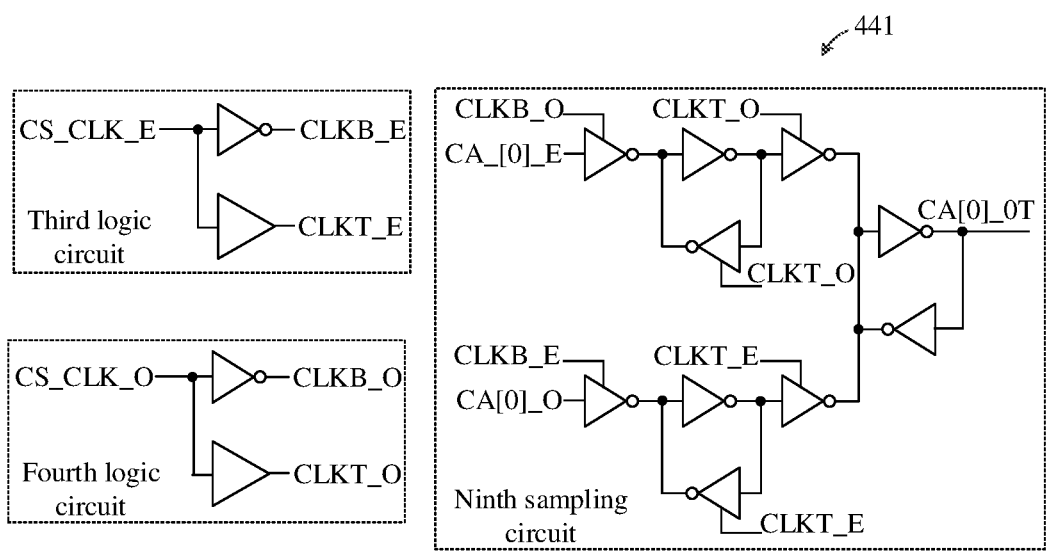
FIG. 8A is a schematic diagram of a composition structure of a first output combined circuit according to an embodiment of the present disclosure.

In some embodiments, as shown in FIG. 8A, the first output combined circuit 441 includes a third logic circuit, a fourth logic circuit, and a ninth sampling circuit.

The third logic circuit is configured to perform a logical operation on the odd CS clock signal to obtain a first enable odd signal and a second enable odd signal. A phase difference between the first enable odd signal and the second enable odd signal is 180 degrees.

The fourth logic circuit is configured to perform a logical operation on the even CS clock signal to obtain a first enable even signal and a second enable even signal. A phase difference between the first enable even signal and the second enable even signal is 180 degrees.

The ninth sampling circuit is configured to sample the second even CA signal and the second odd CA signal according to the first enable even signal, the second enable even signal, the first enable odd signal, and the second enable odd signal to obtain the first target address signal.

It is to be noted that as shown in FIG. 8A, the third logic circuit may include an inverter and a buffer. The first enable even signal may be denoted by CLKB_E, and the second enable even signal may be denoted by CLKT_E. The phase difference between the first enable even signal and the second enable even signal is 180 degrees.

As shown in FIG. 8A, the fourth logic circuit may include an inverter and a buffer. The first enable odd signal may be denoted by CLKB_O, and the second enable odd signal may be denoted by CLKT_O. The phase difference between the first enable odd signal and the second enable odd signal is 180 degrees.

It is also to be noted that the second even CA signal is denoted by CA_E and represents 14 signals CA[0]_E, CA[1]_E, CA[2]_E, . . . , and CA[13]_E. The second odd CA signal is denoted by CA_O and represents 14 signals CA[0]_O, CA[1]_O, CA[2]_O, . . . , and CA[13]_O. In other words, one ninth sampling circuit is required for each group of signals (for example, CA[0]_E and CA[0]_O, CA[1]_E and CA[1]_O, . . . , and CA[13]_E and CA[13]_O). That is, a total of 14 ninth sampling circuits are required in this embodiment of the present disclosure. The group of signals CA[0]_E and CA[0]_O is used as an example. As shown in FIG. 8A, the ninth sampling circuit may include a plurality of enable inverters and a plurality of inverters. CA[0]_O is sampled by using the first enable even signal CLKB_E and the second enable even signal CLKT_E, CA[0]_E is sampled by using the first enable odd signal CLKB_O and the second enable odd signal CLKT_O, and the first target address signal finally output is denoted by CA[0]_0 T.

Figure 9:
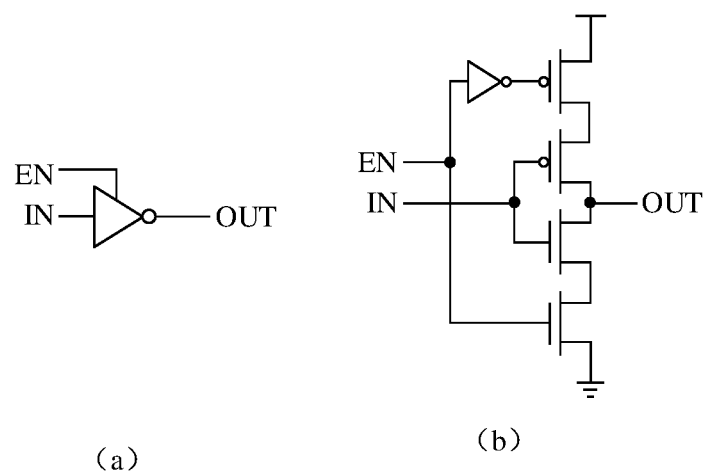
FIG. 9 is a schematic diagram of a specific circuit structure of an enable inverter according to an embodiment of the present disclosure.

In addition, FIG. 9 is a schematic diagram of a specific circuit structure of an enable inverter (denoted by Enable Inverter). (a) is a device symbol of the enable inverter, and (b) is a specific composition of the enable inverter. As shown in FIG. 9, an input signal is denoted by IN, an output signal is denoted by OUT, and an enable signal is denoted by EN. Specifically, in this embodiment of the present disclosure, if the enable signal EN is at a high level, the enable inverter operates, that is, an inverting process is needed to be performed on the input signal IN to obtain the output signal OUT. If the input signal EN is at a low level, the enable inverter is turned off, and an output port of the enable inverter is in a high impedance state.

It is also to be noted that based on the circuit structure of the first output combined circuit 441, in some embodiments, the ninth sampling circuit is specifically configured to: in a case that the even CS clock signal is an active high pulse signal, sample the second odd CA signal according to the first enable even signal and the second enable even signal to obtain the first target address signal; or in a case that the odd CS clock signal is an active high pulse signal, sample the second even CA signal according to the first enable odd signal and the second enable odd signal to obtain the first target address signal.

In other words, an operation principle of the ninth sampling circuit shown in FIG. 8A is as follows. When CLKB_O is at a high level, CA[0]_E is received and transmitted through an enable inverter and an inverter immediately following the enable inverter to a node following this inverter; and when CLKT_O is at a high level, the signal is then output, such that an effect of sampling at the rising edge of CLKT_O is presented. Alternatively, when CLKB_E is at a high level, CA[0]_O is received and transmitted through an enable inverter and an inverter immediately following the enable inverter to a node following this inverter; and when CLKT_E is at a high level, the signal is then output, such that an effect of sampling at the rising edge of CLKT_E is presented. Finally, two inverters connected end to end at CA[0]_0 T serve to maintain the signal.

In this embodiment of the present disclosure, because only one of the even CS clock signal CS_CLK_E and the odd CS clock signal CS_CLK_O is an active high pulse signal, for the ninth sampling circuit, only one of a CLKT_E sampling part and a CLKT_O sampling part operates, and the other part outputs the high impedance state, such that the final CA[0]_0 T can output the result of the operation part.

Figure 8B:
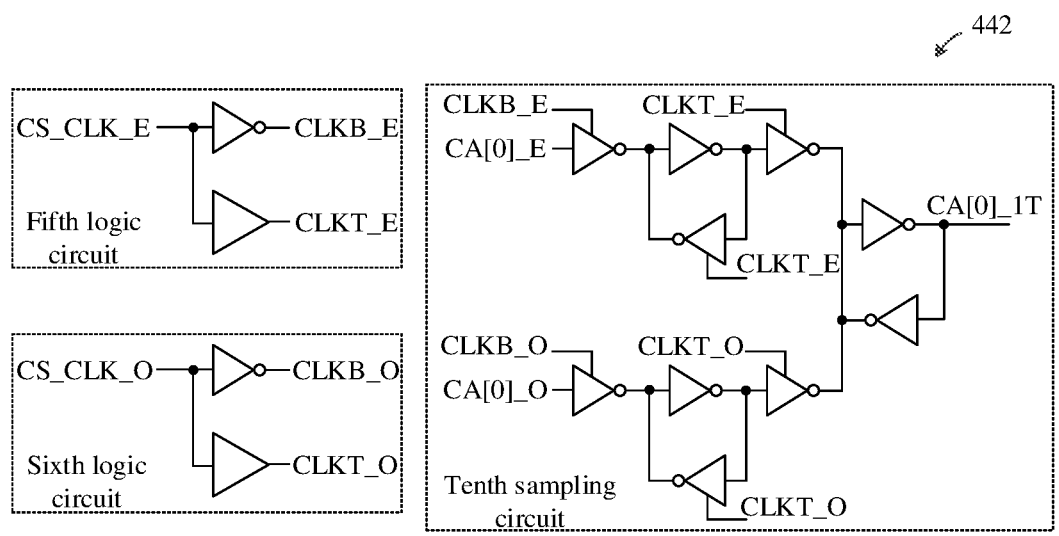
FIG. 8B is a schematic diagram of a composition structure of a second output combined circuit according to an embodiment of the present disclosure.

Similarly, in some embodiments, as shown in FIG. 8B, the second output combined circuit 442 includes a fifth logic circuit, a sixth logic circuit, and a tenth sampling circuit.

The fifth logic circuit is configured to perform a logical operation on the even CS clock signal to obtain a third enable even signal and a fourth enable even signal.

The sixth logic circuit is configured to perform a logical operation on the odd CS clock signal to obtain a third enable odd signal and a fourth enable odd signal.

The tenth sampling circuit is configured to sample the second even CA signal and the second odd CA signal according to the third enable even signal, the fourth enable even signal, the third enable odd signal, and the fourth enable odd signal to obtain the second target address signal.

It is to be noted that as shown in FIG. 8B, the fifth logic circuit may include an inverter and a buffer. The third enable even signal may be denoted by CLKB_E, and the fourth enable even signal may be denoted by CLKT_E. A phase difference between the third enable even signal and the fourth enable even signal is 180 degrees.

As shown in FIG. 8B, the sixth logic circuit may include an inverter and a buffer. The third enable odd signal may be denoted by CLKB_O, and the fourth enable odd signal may be denoted by CLKT_O. A phase difference between the third enable odd signal and the fourth enable odd signal is 180 degrees.

It is also to be noted that based on the circuit structure of the second output combined circuit 442, in some embodiments, the tenth sampling circuit is specifically configured to: in a case that the even CS clock signal is an active high pulse signal, sample the second even CA signal according to the third enable even signal and the fourth enable even signal to obtain the second target address signal; or in a case that the odd CS clock signal is an active high pulse signal, sample the second odd CA signal according to the third enable odd signal and the fourth enable odd signal to obtain the second target address signal.

It is also to be noted that the second even CA signal is denoted by CA_E and represents 14 signals CA[0]_E, CA[1]_E, CA[2]_E, . . . , and CA[13]_E. The second odd CA signal is denoted by CA_O and represents 14 signals CA[0]_O, CA[1]_O, CA[2]_O, . . . , and CA[13]_O. In other words, one tenth sampling circuit is required for each group of signals (for example, CA[0]_E and CA[0]_O, CA[1]_E and CA[1]_O, . . . , and CA[13]_E and CA[13]_O). That is, a total of 14 tenth sampling circuits are required in this embodiment of the present disclosure. The group of signals CA[0]_E and CA[0]_O is used as an example. As shown in FIG. 8B, the tenth sampling circuit may include a plurality of enable inverters and a plurality of inverters. CA[0]_E is sampled by using the third enable even signal CLKB_E and the fourth enable even signal CLKT_E, and CA[0]_O is sampled by using the third enable odd signal CLKB_O and the fourth enable odd signal CLKT_O, and the second target address signal finally output is denoted by CA[0]_1 T.

A specific circuit principle of the second output combined circuit 442 may be understood by referring to the first output combined circuit 441. Details will not be elaborated in the embodiment of the disclosure.

In this way, the first output combined circuit 441 and the second output combined circuit 442 output the first target address signal and the second target address signal. The first target address signal includes information of the first CA signal in the first clock cycle. The second target address signal includes information of the first CA signal in the second clock cycle. The first clock cycle is a clock cycle when the first CS signal is at a low level. The second clock cycle is a next clock cycle of the first clock cycle.

In other words, the signal sampling circuit 40 provided in this embodiment of the present disclosure is applied to a command signal of 2 clock cycles. Specifically, the first CA signal CA includes a valid signal of two clock cycles. The first target address signal CA[13:0]_0 T is a sampling result of the valid signal of the first CA signal CA in the first clock cycle. The second target address signal CA[13:0]_1 T is a sampling result of the valid signal of the first CA signal CA in the second clock cycle. It is to be understood that the clock cycle is determined based on the initial clock signal CK_t/CK_c before the frequency division.

On the one hand, for CA input of two clock cycles, the first CA signal may be sampled and decoded through the command decoding circuit according to the valid CS clock signal to obtain the target command signal. The first CA signal may be sampled through the first output combined circuit according to the valid CS clock signal to obtain the first target address signal. The first CA signal may be sampled through the second output combined circuit according to the valid CS clock signal to obtain the second target address signal. In this way, the timing sequences of the first target address signal, the second target address signal, and the target command signal are aligned. On the other hand, the address buses for odd-even sampling can be combined by shielding the first clock signal when the first CS signal is invalid, to halve the quantity of address buses.

The embodiments of the present disclosure provide a signal sampling circuit. The signal sampling circuit includes an input sampling circuit, a logical operation circuit, a command decoding circuit, and an output combined circuit. The input sampling circuit is configured to sample a first CS signal and a first CA signal according to a first clock signal to obtain a second CS signal and a second CA signal. The second CA signal includes an initial command signal. The second CA signal includes a second odd CA signal and a second even CA signal. The logical operation circuit is configured to perform a logical operation on the first clock signal and the second CS signal to obtain a CS clock signal. The CS clock signal includes an odd CS clock signal and an even CS clock signal. The command decoding circuit is configured to decode and sample the initial command signal according to the second CS signal and the CS clock signal to obtain a target command signal. The output combined circuit is configured to sample the second odd CA signal according to the even CS clock signal or sample the second even CA signal according to the odd CS clock signal to obtain a first target address signal; and sample the second odd CA signal according to the odd CS clock signal or sample the second even CA signal according to the even CS clock signal to obtain a second target address signal. Timing sequences of the target command signal, the first target address signal, and the second target address signal are aligned. In this way, based on the signal sampling circuit, the timing sequences of the target command signal, the first target address signal, and the second target address signal can be aligned under sampling at a same clock cycle, such that there is no timing sequence skew that changes with a PVT between the command signal and the address signal after decoding, thereby avoiding a problem of a next-stage functional module caused due to the timing skew.

Figure 10:
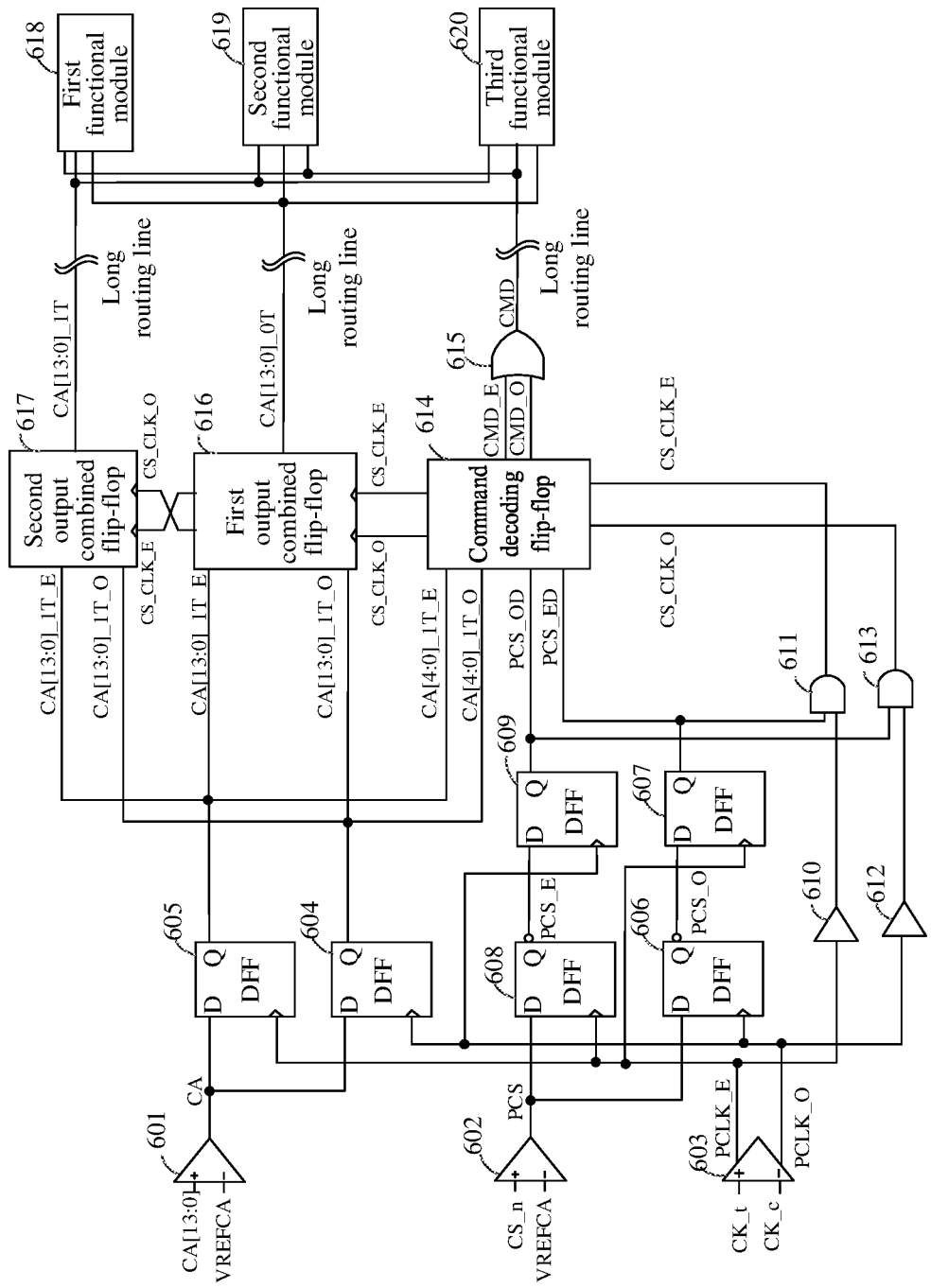
FIG. 10 is a schematic diagram of a detailed structure of a signal sampling circuit according to an embodiment of the present disclosure.

In another embodiment of the present disclosure, based on the signal sampling circuit 40 described in the foregoing embodiment, FIG. 10 is a schematic diagram of a detailed structure of a signal sampling circuit according to an embodiment of the present disclosure. As shown in FIG. 10, the signal sampling circuit 40 may include a first receiver 601, a second receiver 602, a third receiver 603, a first sampling circuit 604, a second sampling circuit 605, a third sampling circuit 606, a fourth sampling circuit 607, a fifth sampling circuit 608, a sixth sampling circuit 609, a first buffer 610, a first AND gate 611, a second buffer 612, a second AND gate 613, a command decoding flip-flop 614, an OR gate 615, a first output combined flip-flop 616, a second output combined flip-flop 617, a first functional module 618, a second functional module 619, and a third functional module 620. The first sampling circuit 604, the second sampling circuit 605, the fourth sampling circuit 607, and the sixth sampling circuit 609 each include a DFF. The third sampling circuit 606 and the fifth sampling circuit 608 each include a DFF and an inverter. The command decoding flip-flop 614 may include a first command decoding circuit and a second command decoding circuit. Specific structures are shown in FIG. 7A and FIG. 7B. An internal structure of the first output combined flip-flop 616 is shown in FIG. 8A. An internal structure of the second output combined flip-flop 617 is shown in FIG. 8B.

In FIG. 10, the input signal of the first receiver 601 is an initial CA signal (denoted by CA[13:0]) and a reference signal (denoted by VREFCA), and an output signal is a first CA signal (denoted by CA). It is to be noted that the initial CA signal CA[13:0] is not one signal, but represents a group of signals. CA[13:0] includes CA[13]~CA[0]. One first receiver 601 is required for each signal. Therefore, 14 first receivers 601 are required in this embodiment of the present disclosure. Only one first receiver 601 is shown in the figure for illustration. The input signal of the second receiver 602 is an initial CS signal (denoted by CS_n) and the reference signal (denoted by VREFCA), and an output signal is a first CS signal (denoted by PCS). An input signal of the third receiver 603 is an initial clock signal (denoted by CK_t/CK_c), and an output signal after frequency division is an even clock signal (denoted by PCLK_E) and an odd clock signal (denoted by PCLK_O). A clock cycle of PCLK_E/PCLK_O is twice a clock cycle of CK_t/CK_c. A frequency of PCLK_E/PCLK_O is half of the frequency of CK_t/CK_c.

Then, the first sampling circuit 604 samples the first CA signal by using the odd clock signal to obtain a second odd CA signal (denoted by CA[13:0]_1 T_O). The second odd CA signal includes an initial command odd signal (denoted by CA[4:0]_1 T_O). The second sampling circuit 605 samples the first CA signal by using the even clock signal to obtain a second even CA signal (denoted by CA[13:0]_1 T_E). The second even CA signal includes an initial command even signal (denoted by CA[4:0]_1 T_E). The third sampling circuit 606 samples and inverts the first CS signal by using the odd clock signal to obtain an intermediate sampling odd signal (denoted by PCS_O). The fourth sampling circuit 607 samples the intermediate sampling odd signal by using the even clock signal to obtain a second CS even signal (denoted by PCS_ED). The fifth sampling circuit 608 samples and inverts the first CS signal by using the even clock signal to obtain an intermediate sampling even signal (denoted by PCS_E). The sixth sampling circuit 609 samples the intermediate sampling even signal by using the odd clock signal to obtain a second CS odd signal (denoted by PCS_OD). The first buffer 610 and the first AND gate 611 perform a logical operation on the even clock signal and the second CS even signal to obtain an even CS clock signal (denoted by CS_CLK_E). The second buffer 612 and the second AND gate 613 perform a logical operation on the odd clock signal and the second CS odd signal to obtain an odd CS clock signal (denoted by CS_CLK_O).

Finally, the command decoding flip-flop 614 decodes and samples the initial command even signal, the initial command odd signal, the second CS even signal, and the second CS odd signal by using the even CS clock signal and the odd CS clock signal to obtain a command even signal (denoted by CMID_E) and a command odd signal (denoted by CMD_O). Then the OR gate 615 performs an OR operation on the command even signal and the command odd signal to obtain a target command signal (denoted by CMD). In addition, for a specific working principle of the command decoding flip-flop 614, reference may be made to the foregoing embodiments. Details will not be elaborated herein.

The first output combined flip-flop 616 samples the second odd CA signal by using the even CS clock signal and samples the second even CA signal by using the odd CS clock signal, and the obtained valid sampling result is the first target address signal (denoted by CA[13:0]_0 T). The second output combined flip-flop 617 samples the second even CA signal by using the second even CA signal and samples the second odd CA signal by using the second odd CA signal, and the obtained valid sampling result is the second target address signal (denoted by CA[13:0]_1 T).

In this way, since the target command signal CMD, the first target address signal CA[13:0]_0 T, and the second target address signal CA[13:0]_1 T are output by performing sampling according to the valid CS clock signal (odd CS clock signal CS_CLK_O or even CS clock signal CS_CLK_E) and output, the timing sequences of the target command signal CMD, the first target address signal CA[13:0]_0 T, and the second target address signal CA[13:0]_1 T are aligned.

In addition, the target command signal CMD, the first target address signal CA[13:0]_0 T, and the second target address signal CA[13:0]_1 T all arrive at the first functional module 618, the second functional module 619, and the third functional module 620 through long routing lines. Because the timing sequences of the target command signal CMD, the first target address signal CA[13:0]_0 T, and the second target address signal CA[13:0]_1 T are aligned, it is necessary to control the lengths and widths of the long routing lines of the target command signal CMD, the first target address signal CA[13:0]_0 T, and the second target address signal CA[13:0]_1 T to be the same as much as possible. In this way, since the output timing sequences of the target command signal CMD, the first target address signal CA[13:0]_0 T, and the second target address signal CA[13:0]_1 T are aligned, no error will occur due to a timing sequence skew when the target command signal CMD, the first target address signal CA[13:0]_0 T, and the second target address signal CA[13:0]_1 T arrive at different functional modules to implement a next-stage function.

Figure 11:
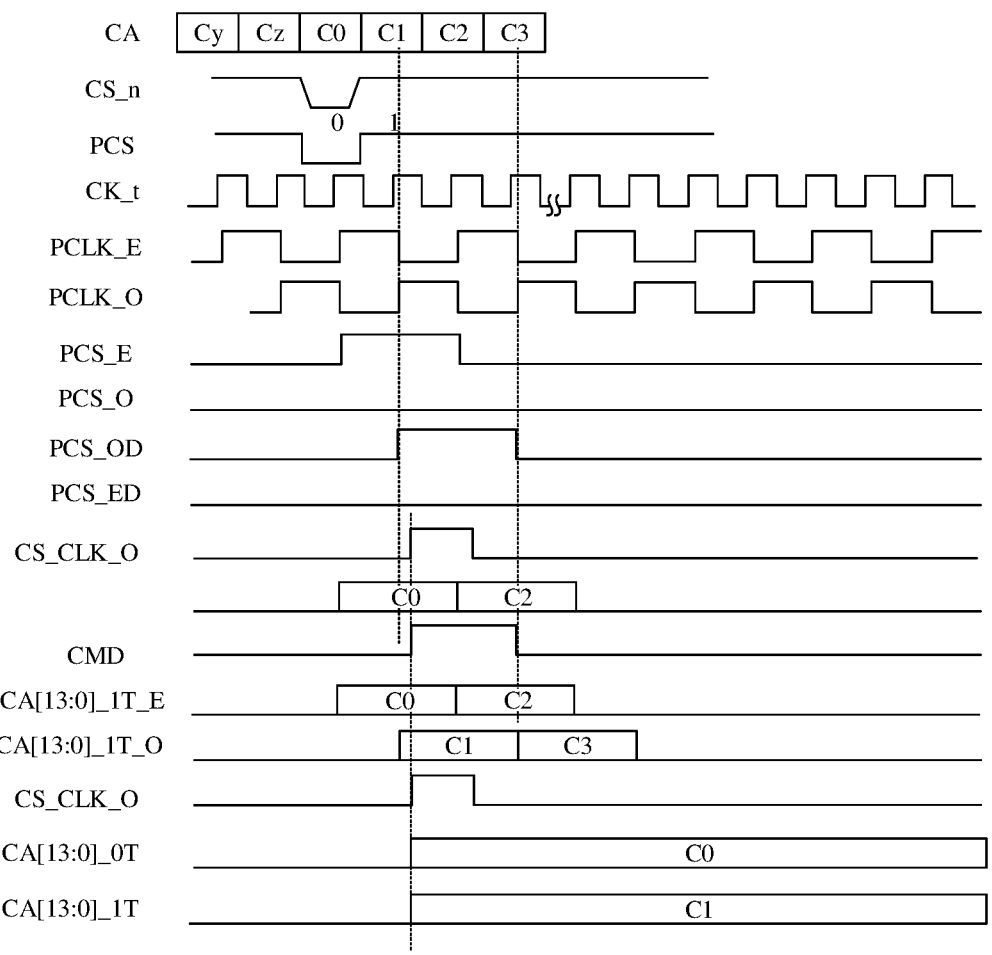
FIG. 11 is a schematic signal timing sequence diagram of a signal sampling circuit according to an embodiment of the present disclosure.

In a specific scenario, it is assumed that the initial CS signal is active low when sampled in an even clock cycle, and a signal timing sequence diagram of the signal sampling circuit shown in FIG. 10 is as shown in FIG. 11. In FIG. 11, the first CA signal CA may include Cy, Cz, C0, C1, C2, and C3. The initial CS signal is denoted by CS_n. The first CS signal is denoted by PCS. PCS is an active low pulse signal with a pulse width of a preset clock cycle. PCS is a signal indicating that a target chip is selected. The description for other signals may refer to the description above. Herein, the even clock cycle or the odd clock cycle is the clock cycle of the initial clock signal CK_t/CK_c. Specifically, the odd clock signal PCLK_E and the even clock signal PCLK_O may be obtained after the frequency division performed by the third receiver 603. Then, a clock cycle in which a rising edge of the even clock signal PCLK_E is located is used as the even clock cycle, and a clock cycle in which a rising edge of the odd clock signal PCLK_O is located is used as the odd clock cycle.

After the first CA signal CA is sampled by using the rising edge of the even clock signal PCLK_E, the second even CA signal CA[13:0]_1 T_E is obtained, and includes C0 and C2. After CA is sampled by using the rising edge of the odd clock signal PCLK_O, the second odd CA signal CA[13:0]_1 T_O is obtained, and includes C1 and C3. In particular, CA[13:0]_1 T_E includes the initial command even signal CA[4:0]_1 T_E.

After the first CS signal PCS is sampled and inverted by using the rising edge of the even clock signal PCLK_E, the intermediate sampling even signal PCS_E is obtained. After the intermediate sampling even signal PCS_E is sampled by using the rising edge of the odd clock signal PCLK_O, the second CS odd signal PCS_OD is obtained. After the first CS signal PCS is sampled and inverted by using the rising edge of the odd clock signal PCLK_O, the intermediate sampling odd signal PCS_O is obtained. The intermediate sampling odd signal PCS_O is sampled by using the rising edge of the even clock signal PCLK_E to obtain the second CS even signal PCS_ED.

In this scenario, the first CS signal PCS is active low when sampled in the even clock cycle. Therefore, both the intermediate sampling even signal PCS_E and the second CS odd signal PCS_OD are active high pulse signals with a pulse width of 2 clock cycles. In addition, the odd CS clock signal CS_CLK_O obtained after the second buffer 612 and the second AND gate 613 perform the logical operation on the odd clock signal PCLK_O and the second CS odd signal PCS_OD is an active high pulse signal with a pulse width of 1 clock cycle. The command decoding flip-flop 614 samples and decodes CA[4:0]_1 T_E by using the odd CS clock signal CS_CLK_O as the valid clock signal to output the target command signal CMD. The first output combined flip-flop 616 samples the second even CA signal CA[13:0]_1 T_E by using the odd CS clock signal CS_CLK_O as the valid clock signal to output the first target address signal CA[13:0]_0 T. The second output combined flip-flop 617 samples the second odd CA signal CA[13:0]_1 T_O by using the odd CS clock signal CS_CLK_O as the valid clock signal to output the second target address signal CA[13:0]_1 T. In this way, the timing sequences of the target command signal CMD, the first target address signal CA[13:0]_0 T, and the second target address signal CA[13:0]_1 T are aligned.

In addition, in this scenario, the initial CS signal is active low when sampled in the even clock cycle. Therefore, both the intermediate sampling odd signal PCS_O and the second CS even signal PCS_ED are invalid signals. The even CS clock signal CS_CLK_E obtained after the first buffer 610 and the first AND gate 611 perform the logical operation on the even clock signal PCLK_E and PCS_ED is also an invalid signal. The command decoding flip-flop 614, the first output combined flip-flop 616, and the second output combined flip-flop 617 do not use the even CS clock signal CS_CLK_E to perform sampling.

Certainly, in another scenario, it is assumed that the initial CS signal is active low when sampled in the odd clock cycle. In this case, the intermediate sampling even signal PCS_E, the second CS odd signal PCS_OD, and the odd CS clock signal CS_CLK_O will be in invalid state. The intermediate sampling odd signal PCS_O, the second CS even signal PCS_ED, and the even CS clock signal CS_CLK_E will be in valid state. The command decoding flip-flop 614, the first output combined flip-flop 616, and the second output combined flip-flop 617 perform sampling according to the even CS clock signal CS_CLK_E to respectively obtain the target command signal CMD, the first target address signal CA[13:0]_0 T, and the second target address signal CA[13:0]_1 T. In this case, the timing sequences of the target command signal CMD, the first target address signal CA[13:0]_0 T, and the second target address signal CA[13:0]_1 T are also aligned.

It is to be noted that in FIG. 11, in the same clock cycle, a delay between the rising edge of the odd clock signal PCLK_O and the rising edge of the odd CS clock signal CS_CLK_O is generated by logic device itself, such as the second buffer 612 and the second AND gate 613.

In summary, in this embodiment of the present disclosure, to avoid an output skew among the target command signal CMD, the first target address signal CA[13:0]_0 T, and the second target address signal CA[13:0]_1 T, sampling may be performed by using the odd CS clock signal CS_CLK_O or the even CS clock signal CS_CLK_E, such that the output timing sequences of the target command signal CMD, the first target address signal CA [13:0]_0 T, and the second target address signal CA[13:0]_1 T are aligned. Therefore, no error will occur due to a timing skew when the target command signal CMD, the first target address signal CA[13:0]_0 T, and the second target address signal CA[13:0]_1 T arrive at different functional modules to implement the next-stage function.

The embodiments of the present disclosure provide a signal sampling circuit. A specific implementation of the foregoing embodiment is described in detail in this embodiment. It can be seen that in the embodiments of the present disclosure, optimization is performed on the basis of existing direct sampling and decoding, such that there is no skew that changes with the PVT between a decoded command (the target command signal) and sampled addresses (the first target address signal and second target address signal). Specifically, in the embodiments of the present disclosure, the command decoding flip-flop, the first output combined flip-flop, and the second output combined flip-flop are added, and a sampling is performed by using the same CS clock signal (CS_CLK_E or CS_CLK_O), such that the timing sequences of the target command signal CMD, the first target address signal CA[13:0]_0 T, and the second target address signal CA[13:0]_1 T can be aligned. In addition, the first output combined flip-flop and the second output combined flip-flop provided in the embodiments of the present disclosure combine the address buses for odd-even samplings, and only the valid address buses are reserved such that the quantity of address buses can be halved.

Figure 12:
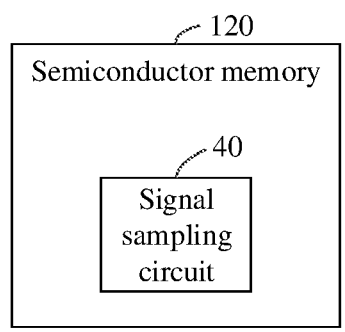
FIG. 12 is a schematic diagram of a composition structure of a semiconductor memory according to an embodiment of the present disclosure.

In another embodiment of the present disclosure, FIG. 12 is a schematic diagram of a composition structure of a semiconductor memory 120 according to an embodiment of the present disclosure. As shown in FIG. 12, the semiconductor memory 120 may include the signal sampling circuit 40 described in any one of the foregoing embodiments.

In this embodiment of the present disclosure, the semiconductor memory 120 may be a DRAM chip.

Further, in some embodiments, the DRAM chip conforms to a DDR5 memory specification.

It is to be noted that the embodiments of the present disclosure mainly relate to circuits for input signal sampling and command decoding in integrated circuit design, and in particular, to a control and adjustment circuit after a CA signal input is used as a command and an address for sampling and decoding in the DRAM chip. Specifically, in the embodiments of the present disclosure, for 2 T CMD, optimization is performed on the basis of existing direct sampling and decoding, such that there is no skew that changes with the PVT between the target command signal CMD after the decoding and the sampled first target address signal CA[13:0]_0 T and second target address signal CA[13:0]_1 T.

It is also to be noted that the embodiments of the present disclosure may be applied to a control circuit for CA signal sampling and decoding in the DRAM chip, but are not limited thereto. Another circuit for input signal sampling and command decoding may use this design.

In this embodiment of the present disclosure, the semiconductor memory 120 includes the signal sampling circuit 40. Therefore, the timing sequences of the target command signal, the first target address signal, and the second target address signal can be aligned under sampling at a same clock cycle, such that there is no timing sequence skew that changes with a PVT between the decoded command signal and the address signal, thereby avoiding a problem of a next-stage functional module due to the timing skew.

The foregoing descriptions are merely preferred embodiments of the present disclosure, and are not intended to limit the protection scope of the present disclosure.

It is to be noted that terms "including", "comprising", or any other variants thereof in the present disclosure are intended to cover non-exclusive inclusion, such that a process, method, article, or apparatus including a series of elements includes not only those elements but also other elements not explicitly listed, or elements inherent to such a process, method, article, or apparatus. Without further limitation, an element qualified by the phrase "including a . . . " does not exclude the presence of an additional identical element in the process, method, article, or apparatus including the element.

The serial numbers of the embodiments of the present disclosure are merely for description and do not represent a preference of the embodiments.

The methods disclosed in several method embodiments provided in the present disclosure may be arbitrarily combined without conflicts to obtain a new method embodiment. Features disclosed in several product embodiments provided in the present disclosure may be arbitrarily combined without conflicts to obtain a new product embodiment. Features disclosed in several method or device embodiments provided in the present disclosure may be arbitrarily combined without conflicts to obtain a new method embodiment or device embodiment.

The foregoing merely describes specific implementations of the present disclosure, but the protection scope of the present disclosure is not limited thereto. Any person skilled in the art can easily conceive modifications or replacements within the technical scope of the present disclosure, and these modifications or replacements shall fall within the protection scope of the present disclosure. Therefore, the protection scope of the present disclosure shall be subject to the protection scope of the claims.

INDUSTRIAL APPLICABILITY

The embodiments of the present disclosure provide the signal sampling circuit and the semiconductor memory. The signal sampling circuit includes: the input sampling circuit configured to sample the first CS signal and the first CA signal according to the first clock signal to obtain the second CS signal and the second CA signal; the logical operation circuit configured to perform the logical operation on the first clock signal and the second CS signal to obtain the CS clock signal; the command decoding circuit configured to decode and sample the initial command signal according to the second CS signal and the CS clock signal to obtain the target command signal; and the output combined circuit configured to: sample the second odd CA signal and the second even CA signal according to the even CS clock signal and the odd CS clock signal, respectively, to obtain a first target address signal; and samples the second odd CA signal and the second even CA signal according to the odd CS clock signal and the even CS clock signal, respectively, to obtain a second target address signal. The embodiments of the present disclosure can avoid a signal timing sequence skew.

The invention claimed is:

1. A signal sampling circuit, comprising an input sampling circuit, a logical operation circuit, a command decoding circuit, and an output combined circuit; wherein
the input sampling circuit is configured to sample a first chip select (CS) signal and a first command/address (CA) signal, respectively, according to a first clock signal to obtain a second CS signal and a second CA signal; wherein the second CA signal comprises an initial command signal, and the second CA signal comprises a second odd CA signal and a second even CA signal;
the logical operation circuit is configured to perform a logical operation on the first clock signal and the second CS signal to obtain a CS clock signal; wherein the CS clock signal comprises an odd CS clock signal and an even CS clock signal;
the command decoding circuit is configured to decode and sample the initial command signal according to the second CS signal and the CS clock signal to obtain a target command signal; and
the output combined circuit is configured to sample the second odd CA signal and the second even CA signal according to the even CS clock signal and the odd CS clock signal, respectively, to obtain a first target address signal; and sample the second odd CA signal and the second even CA signal according to the odd CS clock signal and the even CS clock signal, respectively, to obtain a second target address signal;
wherein the signal sampling circuit further comprising a receiving circuit, wherein the receiving circuit comprises a first receiving circuit, a second receiving circuit, and a third receiving circuit;
the first receiving circuit is configured to receive an initial CA signal and output the first CA signal;
the second receiving circuit is configured to receive an initial CS signal and output the first CS signal;
the third receiving circuit is configured to receive an initial clock signal and perform frequency division on the initial clock signal to obtain an odd clock signal and an even clock signal; and
clock cycles of both the odd clock signal and the even clock signal are twice a clock cycle of the initial clock signal, a phase difference between the odd clock signal and the even clock signal is 180 degrees, and the odd clock signal and the even clock signal constitute the first clock signal;
wherein the input sampling circuit comprises a CA sampling circuit, and the CA sampling circuit comprises a first sampling circuit and a second sampling circuit;
the first sampling circuit is configured to sample the first CA signal according to the odd clock signal to obtain the second odd CA signal;
the second sampling circuit is configured to sample the first CA signal according to the even clock signal to obtain the second even CA signal; and
the initial command signal comprises an initial command even signal and an initial command odd signal, the second even CA signal comprises the initial command even signal, and the second odd CA signal comprises the initial command odd signal;
wherein the input sampling circuit further comprises a CS sampling circuit, and the CS sampling circuit comprises a third sampling circuit, a fourth sampling circuit, a fifth sampling circuit, and a sixth sampling circuit;
the third sampling circuit is configured to sample the first CS signal according to the odd clock signal to obtain an intermediate sampling odd signal;
the fourth sampling circuit is configured to sample the intermediate sampling odd signal according to the even clock signal to obtain a second CS even signal;
the fifth sampling circuit is configured to sample the first CS signal according to the even clock signal to obtain an intermediate sampling even signal;
the sixth sampling circuit is configured to sample the intermediate sampling even signal according to the odd clock signal to obtain a second CS odd signal; and
the second CS signal comprises the second CS even signal and the second CS odd signal;
wherein the logical operation circuit comprises a first logic circuit and a second logic circuit;
the first logic circuit is configured to receive the even clock signal and the second CS even signal, and perform a logical operation on the even clock signal and the second CS even signal to obtain the even CS clock signal; and
the second logic circuit is configured to receive the odd clock signal and the second CS odd signal, and perform a logical operation on the odd clock signal and the second CS odd signal to obtain the odd CS clock signal; and
wherein the first logic circuit comprises a first buffer and a first AND gate;
the first buffer is configured to delay the even clock signal to obtain an intermediate even clock signal; and
the first AND gate is configured to perform an AND operation on the second CS even signal and the intermediate even clock signal to obtain the even CS clock signal.

2. The signal sampling circuit of claim 1, wherein the second logic circuit comprises a second buffer and a second AND gate;
the second buffer is configured to delay the odd clock signal to obtain an intermediate odd clock signal; and
the second AND gate is configured to perform an AND operation on the second CS odd signal and the intermediate odd clock signal to obtain the odd CS clock signal.

3. A signal sampling circuit, comprising an input sampling circuit, a logical operation circuit, a command decoding circuit, and an output combined circuit; wherein
the input sampling circuit is configured to sample a first chip select (CS) signal and a first command/address (CA) signal, respectively, according to a first clock signal to obtain a second CS signal and a second CA signal; wherein the second CA signal comprises an initial command signal, and the second CA signal comprises a second odd CA signal and a second even CA signal;
the logical operation circuit is configured to perform a logical operation on the first clock signal and the second CS signal to obtain a CS clock signal; wherein the CS clock signal comprises an odd CS clock signal and an even CS clock signal;
the command decoding circuit is configured to decode and sample the initial command signal according to the second CS signal and the CS clock signal to obtain a target command signal; and the output combined circuit is configured to sample the second odd CA signal and the second even CA signal according to the even CS clock signal and the odd CS clock signal, respectively, to obtain a first target address signal; and sample the second odd CA signal and the second even CA signal according to the odd CS clock signal and the even CS clock signal, respectively, to obtain a second target address signal;

wherein the signal sampling circuit further comprising a receiving circuit, wherein the receiving circuit comprises a first receiving circuit, a second receiving circuit, and a third receiving circuit;

the first receiving circuit is configured to receive an initial CA signal and output the first CA signal;

the second receiving circuit is configured to receive an initial CS signal and output the first CS signal;

the third receiving circuit is configured to receive an initial clock signal and perform frequency division on the initial clock signal to obtain an odd clock signal and an even clock signal; and clock cycles of both the odd clock signal and the even clock signal are twice a clock cycle of the initial clock signal, a phase difference between the odd clock signal and the even clock signal is 180 degrees, and the odd clock signal and the even clock signal constitute the first clock signal;

wherein the input sampling circuit comprises a CA sampling circuit, and the CA sampling circuit comprises a first sampling circuit and a second sampling circuit;

the first sampling circuit is configured to sample the first CA signal according to the odd clock signal to obtain the second odd CA signal;

the second sampling circuit is configured to sample the first CA signal according to the even clock signal to obtain the second even CA signal; and the initial command signal comprises an initial command even signal and an initial command odd signal, the second even CA signal comprises the initial command even signal, and the second odd CA signal comprises the initial command odd signal;

wherein the input sampling circuit further comprises a CS sampling circuit, and the CS sampling circuit comprises a third sampling circuit, a fourth sampling circuit, a fifth sampling circuit, and a sixth sampling circuit;

the third sampling circuit is configured to sample the first CS signal according to the odd clock signal to obtain an intermediate sampling odd signal;

the fourth sampling circuit is configured to sample the intermediate sampling odd signal according to the even clock signal to obtain a second CS even signal;

the fifth sampling circuit is configured to sample the first CS signal according to the even clock signal to obtain an intermediate sampling even signal;

the sixth sampling circuit is configured to sample the intermediate sampling even signal according to the odd clock signal to obtain a second CS odd signal; and the second CS signal comprises the second CS even signal and the second CS odd signal;

wherein the command decoding circuit comprises a first command decoding circuit, a second command decoding circuit, and an OR gate;

the first command decoding circuit is configured to decode and sample the initial command odd signal according to the even CS clock signal and the second CS even signal to obtain a command even signal;

the second command decoding circuit is configured to decode and sample the initial command even signal according to the odd CS clock signal and the second CS odd signal to obtain a command odd signal; and the OR gate is configured to perform an OR operation on the command even signal and the command odd signal to obtain the target command signal.

4. The signal sampling circuit of claim 3, wherein the first command decoding circuit comprises a first decoding circuit, a seventh sampling circuit, and a third AND gate;

the first decoding circuit is configured to decode the initial command odd signal to obtain a command decoding odd signal;

the seventh sampling circuit is configured to sample the command decoding odd signal according to the even CS clock signal to obtain a command sampling even signal; and the third AND gate is configured to perform an AND operation on the second CS even signal and the command sampling even signal to obtain the command even signal.

5. The signal sampling circuit of claim 3, wherein the second command decoding circuit comprises a second decoding circuit, an eighth sampling circuit, and a fourth AND gate;

the second decoding circuit is configured to decode the initial command even signal to obtain a command decoding even signal;

the eighth sampling circuit is configured to sample the command decoding even signal according to the odd CS clock signal to obtain a command sampling odd signal; and the fourth AND gate is configured to perform an AND operation on the second CS odd signal and the command sampling odd signal to obtain the command odd signal.

6. A signal sampling circuit, comprising an input sampling circuit, a logical operation circuit, a command decoding circuit, and an output combined circuit; wherein the input sampling circuit is configured to sample a first chip select (CS) signal and a first command/address (CA) signal, respectively, according to a first clock signal to obtain a second CS signal and a second CA signal; wherein the second CA signal comprises an initial command signal, and the second CA signal comprises a second odd CA signal and a second even CA signal;

the logical operation circuit is configured to perform a logical operation on the first clock signal and the second CS signal to obtain a CS clock signal; wherein the CS clock signal comprises an odd CS clock signal and an even CS clock signal;

the command decoding circuit is configured to decode and sample the initial command signal according to the second CS signal and the CS clock signal to obtain a target command signal; and the output combined circuit is configured to sample the second odd CA signal and the second even CA signal according to the even CS clock signal and the odd CS clock signal, respectively, to obtain a first target address signal; and sample the second odd CA signal and the second even CA signal according to the odd CS clock signal and the even CS clock signal, respectively, to obtain a second target address signal;

wherein the signal sampling circuit further comprising a receiving circuit, wherein the receiving circuit comprises a first receiving circuit, a second receiving circuit, and a third receiving circuit;
the first receiving circuit is configured to receive an initial CA signal and output the first CA signal;
the second receiving circuit is configured to receive an initial CS signal and output the first CS signal;
the third receiving circuit is configured to receive an initial clock signal and perform frequency division on the initial clock signal to obtain an odd clock signal and an even clock signal; and
clock cycles of both the odd clock signal and the even clock signal are twice a clock cycle of the initial clock signal, a phase difference between the odd clock signal and the even clock signal is 180 degrees, and the odd clock signal and the even clock signal constitute the first clock signal;
wherein the input sampling circuit comprises a CA sampling circuit, and the CA sampling circuit comprises a first sampling circuit and a second sampling circuit;
the first sampling circuit is configured to sample the first CA signal according to the odd clock signal to obtain the second odd CA signal;
the second sampling circuit is configured to sample the first CA signal according to the even clock signal to obtain the second even CA signal; and
the initial command signal comprises an initial command even signal and an initial command odd signal, the second even CA signal comprises the initial command even signal, and the second odd CA signal comprises the initial command odd signal;
wherein the output combined circuit comprises a first output combined circuit and a second output combined circuit;
the first output combined circuit is configured to sample the second even CA signal according to the odd CS clock signal to obtain the first target address signal; or
sample the second odd CA signal according to the even CS clock signal to obtain the first target address signal;
the second output combined circuit is configured to sample the second odd CA signal according to the odd CS clock signal to obtain the second target address signal;
or sample the second even CA signal according to the even CS clock signal to obtain the second target address signal; and
a first data port, a second data port, a first clock port and a second clock port of the first output combined circuit are connected with the second odd CA signal, the second even CA signal, the even CS clock signal and the odd CS clock signal, respectively; and a first data port, a second data port, a first clock port and a second clock port of the second output combined circuit are connected with the second odd CA signal, the second even CA signal, the odd CS clock signal and the even CS clock signal, respectively.

7. The signal sampling circuit of claim 6, wherein the first output combined circuit comprises a third logic circuit, a fourth logic circuit, and a ninth sampling circuit;
the third logic circuit is configured to perform a logical operation on the odd CS clock signal to obtain a first enable odd signal and a second enable odd signal, and a phase difference between the first enable odd signal and the second enable odd signal is 180 degrees;
the fourth logic circuit is configured to perform a logical operation on the even CS clock signal to obtain a first enable even signal and a second enable even signal, and a phase difference between the first enable even signal and the second enable even signal is 180 degrees; and
the ninth sampling circuit is configured to sample the second even CA signal and the second odd CA signal according to the first enable even signal, the second enable even signal, the first enable odd signal, and the second enable odd signal to obtain the first target address signal.

8. The signal sampling circuit of claim 7, wherein
the ninth sampling circuit is specifically configured to: in a case that the even CS clock signal is an active high pulse signal, sample the second odd CA signal according to the first enable even signal and the second enable even signal to obtain the first target address signal; or in a case that the odd CS clock signal is an active high pulse signal, sample the second even CA signal according to the first enable odd signal and the second enable odd signal to obtain the first target address signal.

9. The signal sampling circuit of claim 6, wherein the second output combined circuit comprises a fifth logic circuit, a sixth logic circuit, and a tenth sampling circuit;
the fifth logic circuit is configured to perform a logical operation on the even CS clock signal to obtain a third enable even signal and a fourth enable even signal, and a phase difference between the third enable even signal and the fourth enable even signal is 180 degrees;
the sixth logic circuit is configured to perform a logical operation on the odd CS clock signal to obtain a third enable odd signal and a fourth enable odd signal; and a phase difference between the third enable odd signal and the fourth enable odd signal is 180 degrees; and
the tenth sampling circuit is configured to sample the second even CA signal and the second odd CA signal according to the third enable even signal, the fourth enable even signal, the third enable odd signal, and the fourth enable odd signal to obtain the second target address signal.

10. The signal sampling circuit of claim 9, wherein
the tenth sampling circuit is specifically configured to: in a case that the even CS clock signal is an active high pulse signal, sample the second even CA signal according to the third enable even signal and the fourth enable even signal to obtain the second target address signal; or in a case that the odd CS clock signal is an active high pulse signal, sample the second odd CA signal according to the third enable odd signal and the fourth enable odd signal to obtain the second target address signal.

11. The signal sampling circuit of claim 1, wherein the first CS signal is a signal indicating that a target chip is selected, and the first CS signal is an active low pulse signal; and
in response to that the first CS signal is sampled as a low level at a rising edge of an even clock cycle, the second CS odd signal is an active high pulse signal and the odd CS clock signal is an active high pulse signal; or in response to that the first CS signal is sampled as a low level at a rising edge of an odd clock cycle, the second CS even signal is an active high pulse signal and the even CS clock signal is an active high pulse signal.

12. The signal sampling circuit of claim 11, wherein the first target address signal comprises information of the first CA signal in a first clock cycle, the second target address signal comprises information of the first CA signal in a second clock cycle, the first clock cycle is a clock cycle when the first CS signal is at a low level, and the second clock cycle is a next clock cycle of the first clock cycle.

13. A semiconductor memory, comprising the signal sampling circuit of claim 3.

14. The semiconductor memory of claim 13, wherein the semiconductor memory is a dynamic random access memory (DRAM) chip.

15. The signal sampling circuit of claim 1, wherein the command decoding circuit is directly connected to the input sampling circuit and the logical operation circuit, and receives the second CS signal and the CS clock signal.

16. The signal sampling circuit of claim 3, wherein the command decoding circuit is directly connected to the input sampling circuit and the logical operation circuit, and receives the second CS signal and the CS clock signal.

17. The signal sampling circuit of claim 6, wherein the command decoding circuit is directly connected to the input sampling circuit and the logical operation circuit, and receives the second CS signal and the CS clock signal.

\* \* \* \* \*